United States Patent
Ge et al.

(10) Patent No.: US 10,666,392 B2
(45) Date of Patent: May 26, 2020

(54) APPARATUS AND METHODS FOR RATE MATCHING IN POLAR CODING

(71) Applicant: HUAWEI TECHNOLOGIES Co., LTD., Shanzhen, Guangdong (CN)

(72) Inventors: Yiqun Ge, Kanata (CA); Hamid Saber, Ottawa (CA)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 106 days.

(21) Appl. No.: 15/939,750

(22) Filed: Mar. 29, 2018

(65) Prior Publication Data

US 2019/0305889 A1    Oct. 3, 2019

(51) Int. Cl.
   *H04L 1/00*    (2006.01)
(52) U.S. Cl.
   CPC .......... *H04L 1/0068* (2013.01); *H04L 1/0041* (2013.01); *H04L 1/0058* (2013.01)
(58) Field of Classification Search
   CPC ............................ H03M 13/13; H04L 1/0068
   See application file for complete search history.

(56) References Cited

U.S. PATENT DOCUMENTS

| 9,239,778 | B2* | 1/2016 | Lee | H03M 13/1111 |
| 10,340,950 | B2* | 7/2019 | Klein | |
| 2016/0285479 | A1* | 9/2016 | El-Khamy | H03M 13/6368 |
| 2017/0111060 | A1 | 4/2017 | Huang et al. | |
| 2017/0331590 | A1* | 11/2017 | Wu | H04L 1/0068 |
| 2018/0026663 | A1* | 1/2018 | Wu | H03M 13/155 |
| | | | | 714/776 |

FOREIGN PATENT DOCUMENTS

CN    107395324 A    11/2017

OTHER PUBLICATIONS

A. J. Ferrus and D. Poulin, "Branching MERA codes: A natural extension of classic and quantum polar codes", in Proc. Intl Symp. Inf. Theory (ISIT) 2014, Honolulu, HI, USA, Jun. 2014.*
E. Arikan, "Channel Polarization: A Method for Constructing Capacity-Achieving Codes for Symmetric Binary-Input Memoryless Channels," IEEE Transactions on Information Theory, vol. 55, No. 7, 2009, pp. 3051-3073.

(Continued)

*Primary Examiner* — Steve N Nguyen

(57) ABSTRACT

Disabled input bit positions of an input bit vector that is to be encoded are determined based on non-contiguous subsets of consecutive coded bit positions that are to be punctured from a codeword of a polar code. The input bit vector is encoded according to the polar code to generate a codeword, by applying information bits to input bit positions of the input bit vector other than the disabled input bit positions. The non-contiguous subsets of consecutive coded bit positions are punctured from the codeword to generate a punctured codeword, and the punctured codeword is transmitted. In some embodiments, the non-contiguous subsets include a first subset that includes a first coded bit position and a second subset that includes a last coded bit position. The polar code could be a chained polar code, for example.

27 Claims, 21 Drawing Sheets

(56) References Cited

OTHER PUBLICATIONS

Tal and Vardy, "List Decoding of Polar Codes", Proceedings of the 2011 IEEE International Symposium on Information Theory, Jul. 2011, 11 pages.
Mori R, Tanaka T., "Performance and Construction of Polar Codes on Symmetric Binary-Input Memoryless Channels", IEEE International Symposium on Information Theory, 2009, pp. 1496-1500.
J.Dai, K.Niu, Z.Si, J.Lin, "Evaluation and Optimization of Gaussian Approximation for Polar Codes", May 2016, 4 pages.
P. Trifonov, "Efficient Design and Decoding of Polar Codes." IEEE Transactions on Communications 60.11 (2012): pp. 3221-3227.
R1-1611254, "Details of the Polar Code Design", Huawei & HiSilicon, 3GPP TSG RAN WG1 Meeting #87, Nov. 10-14, 2016, 33 pages.
A. J. Ferrus, C. Hirche and D. Poulin, "Convolutional Polar Codes", arXiv:1704.00715, Apr. 3, 2017, 25 pages.
Samsung, Rate Matching Scheme for Polar Codes. 3GPP TSG RAN WG1 #90 Prague, Czechia Aug. 21-25, 2017, R1-1714179, 7 pages.
LG Electronics, Design of Polar code for control channel Document for: Discussion and decision. 3GPP TSG RAN WG1 Meeting #88bis Spokane, USA, Apr. 3-7, 2017, R1-1704932, 4 pages.
Huawei,HiSilicon, Polar codes—encoding and decoding. 3GPP TSG RAN WG1 Meeting #xx Nanjing, China, May 23-27, 2016, R1-164039, 7 pages.

\* cited by examiner $$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

$$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

FIG. 1

APPARATUS AND METHODS FOR RATE MATCHING IN POLAR CODING

FIELD

The present disclosure relates to generally to communications and, in particular, to rate matching for polar codes and coding.

BACKGROUND

Polar codes are proposed as channel codes for use in future wireless communications, and have been selected for uplink and downlink enhanced Mobile Broadband (eMBB) control channel coding for the new $5^{th}$ Generation (5G) air interface, also known as the 5G New Radio (NR). These codes are competitive with state-of-the-art error correction codes and have low encoding complexity. See E. Arikan, "Channel polarization: A method for constructing capacity-achieving codes for symmetric binary-input memoryless channels," IEEE Trans. Inf. Theory, vol. 55, no. 7, pp. 3051-3073, 2009. Successive Cancellation List (SCL) decoding and its extensions (e.g., SC List decoding) are effective and efficient options for decoding polar coded information.

Based on channel polarization, Arikan designed a channel code that is proven to reach channel capacity. Polarization refers to a coding property that, as code length increases to infinity, bit-channels also referred to as sub-channels polarize and their capacities approach either zero (completely noisy channel) or one (completely perfect channel). In other words, bits encoded in high capacity sub-channels will experience a channel with high Signal-to-Noise Ratio (SNR), and will have a relatively high reliability or a high likelihood of being correctly decoded, and bits encoded in low capacity sub-channels will experience a channel with low SNR, and will have low reliability or a low possibility to be correctly decoded. The fraction of perfect bit-channels is equal to the capacity of this channel.

SUMMARY

Illustrative embodiments are disclosed herein by way of example.

The present disclosure relates in part to a method for generating and transmitting a codeword. The method involves determining disabled input bit positions of an input bit vector, based on non-contiguous subsets of consecutive coded bit positions that are to be punctured from a codeword of a polar code. In encoding the input bit vector according to the polar code to generate a codeword, information bits are applied to input bit positions of the input bit vector other than the disabled input bit positions. The non-contiguous subsets of consecutive coded bit positions are punctured from the codeword to generate a punctured codeword, and the punctured codeword is transmitted.

In an embodiment, a non-transitory processor-readable medium could store instructions which, when executed by one or more processors, cause the one or more processors to perform such a method for generating and transmitting a codeword. The method could involve determining, based on non-contiguous subsets of consecutive coded bit positions that are to be punctured from a codeword of a polar code, disabled input bit positions of an input bit vector; encoding the input bit vector according to the polar code to generate a codeword, with the encoding involving applying information bits to input bit positions of the input bit vector other than the disabled input bit positions; puncturing from the codeword the non-contiguous subsets of consecutive coded bit positions that are to be punctured, to generate a punctured codeword; and transmitting the punctured codeword.

A medium storing such instructions could be combined with a processor. For example, an apparatus could include a processor and a memory coupled to the processor, with the memory storing instructions which, when executed by the processor, cause the processor to perform a method. The method could be a method for generating and transmitting a codeword as disclosed herein, and could include determining, based on non-contiguous subsets of consecutive coded bit positions that are to be punctured from a codeword of a polar code, disabled input bit positions of an input bit vector; encoding the input bit vector according to the polar code to generate a codeword, by applying information bits to input bit positions of the input bit vector other than the disabled input bit positions; puncturing from the codeword the non-contiguous subsets of consecutive coded bit positions that are to be punctured, to generate a punctured codeword; and transmitting the punctured codeword.

According to another aspect of the present disclosure, an apparatus for generating and transmitting a codeword includes a code processing module, an encoder module coupled to the code processing module, a post-encoding processing module coupled to the encoder module, and a transmitter coupled to the post-encoding processing module. The code processing module is configured to determine, based on non-contiguous subsets of consecutive coded bit positions that are to be punctured from a codeword of a polar code, disabled input bit positions of an input bit vector. The encoder module is configured to encode the input bit vector according to the polar code to generate a codeword, by applying information bits to input bit positions of the input bit vector other than the disabled input bit positions. The post-encoding processing module is configured to generate a punctured codeword by puncturing from the codeword the non-contiguous subsets of consecutive coded bit positions that are to be punctured. The transmitter is configured to transmit the punctured codeword.

Apparatus as disclosed herein could be implemented in user equipment and/or communication network equipment.

Other aspects and features of embodiments of the present disclosure will become apparent to those ordinarily skilled in the art upon review of the following description.

BRIEF DESCRIPTION OF THE DRAWINGS

Examples of embodiments will now be described in greater detail with reference to the accompanying drawings.

FIG. 1 is a diagram showing one example of how a polar coding generator matrix can be produced from a kernel.

DETAILED DESCRIPTION

FIG. 1 is a diagram showing, by way of an illustrative example, how a polar coding generator matrix can be produced from a kernel $G_2$ 100. Note that FIG. 1 is an example. Other forms of kernel are also possible.

A polar code can be formed from a Kronecker product matrix based on a seed matrix $F=G_2$ 100. For a polar code having codewords of length $N=2^m$, the generator matrix is $G_2^{\otimes m}$. The 2-fold Kronecker product matrix $G_2^{\otimes 2}$ 102 and the 3-fold Kronecker product matrix $G_2^{\otimes 3}$ 104 in FIG. 1 are examples of polar coding generator matrices. The generator matrix approach illustrated in FIG. 1 can be expanded to produce an m-fold Kronecker product matrix $G_2^{\otimes m}$.

Figures 2, 3:
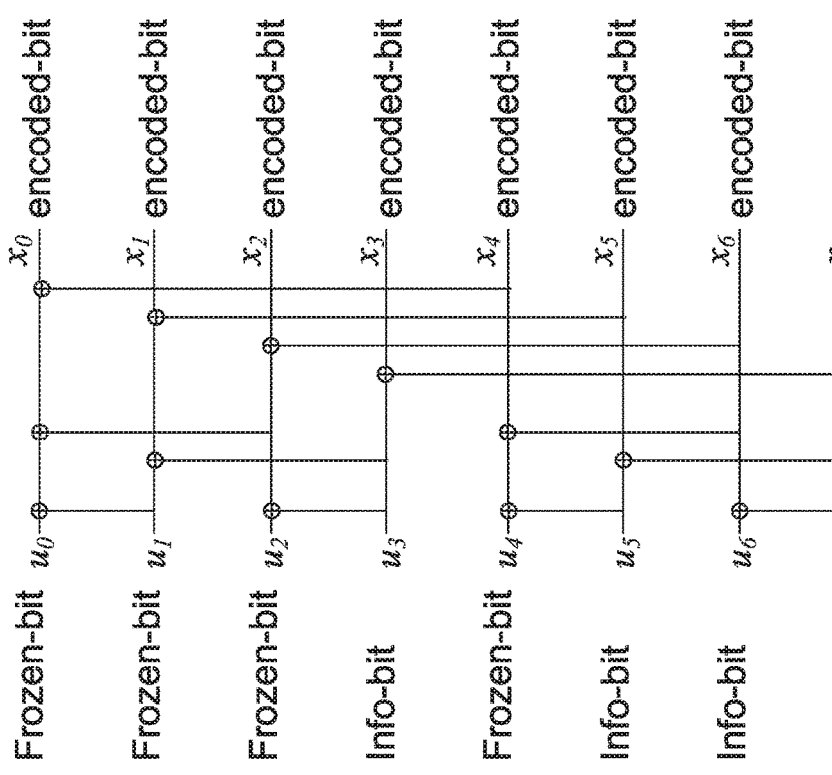
FIGS. 2 and 3 show an example use of a polar coding generator matrix for producing codewords and a schematic illustration of an example polar encoder.

FIGS. 2 and 3 show an example use of a polar coding generator matrix for producing codewords and a schematic illustration of an example polar encoder. In FIG. 2, the generator matrix $G_2^{\otimes 3}$ 104 is used to produce codewords of length $2^3=8$. A codeword x is formed by the product of an input vector $u=[0\ 0\ 0\ u_3\ 0\ u_5\ u_6\ u_7]$ and the generator matrix $G_2^{\otimes 3}$ 104 as indicated at 200. The input vector u is composed of information bits and fixed or frozen bits. In the specific example shown in FIGS. 2 and 3, N=8, so the input vector u is an 8-bit vector, and the codeword x is an 8-bit vector. The input vector has frozen bits in positions 0, 1, 2 and 4, and has information bits at positions 3, 5, 6, and 7. An example implementation of an encoder that generates codewords is indicated in FIG. 3 at 212, where the frozen bits are all set to 0, and the circled "+" symbols represent modulo 2 addition. For the example of FIGS. 2 and 3, an N=8-bit input vector is formed from K=4 information bits and N−K=4 frozen bits. Codes of this form are referred to as polar codes and the encoder is referred to as a polar encoder. Decoders for decoding polar codes are referred to as polar decoders. Frozen bits are set to zero in the example shown in FIGS. 2 and 3. However, frozen bits could be set to other bit values that are known to both an encoder and a decoder. For ease of description, all-zero frozen bits are considered herein, and may be generally preferred.

As is known, polar coding may be performed with or without bit reversal. The example polar encoder in FIG. 3 is without bit reversal.

Generally, the output of a polar encoder can be expressed as $x_0^{N-1}=u_0^{N-1}G_N$, where, without bit reversal, $G_N=F^{\otimes n}$ is an N-by-N generator matrix, $N=2^n$, $n \geq 1$ (e.g. for n=1, $G_2=F$ (indicated as 100 in FIG. 1)). For bit reversal, $G_N=B_N F^{\otimes n}$, where $B_N$ is an N-by-N bit-reversal permutation matrix.

Embodiments disclosed herein could be implemented without or with bit reversal.

In polar code construction, ideally the more "reliable" bit positions (sometimes referred to as bit or sub-channel indices) of an input vector are used to carry the information bits, and the more "unreliable" bit positions of an input vector are used to carry the frozen bits (i.e., bits already known to both encoder and decoder). However, when information is transmitted over a physical channel, the reliability of a given bit position is also a function of the characteristics of the physical channel, such as the erasure rate or the Signal-to-Noise Ratio (SNR) of the physical channel. A reliability sequence (reliable and unreliable positions) could be calculated based on assumed or measured characteristics of the physical channel before the information is transmitted over the channel, for example. In theory, the frozen bits can be set to any value as long as the location of each frozen bit is known to both the encoder and the decoder. In conventional applications, the frozen bits are all set to zero.

With a sufficiently long code length, a code designed according to polarization theory can reach the channel capacity in a binary symmetric memoryless channel if a Successive Cancellation (SC) decoding algorithm is used. A very simple SC decoding algorithm was analyzed and simulated by Arikan.

In practice, a code length cannot be infinite and a channel cannot be a binary memoryless channel, and therefore channel capacity cannot be reached by such a simple SC decoder. According to Arikan, the channel capacity can be approached when using SC decoding if a code length is over $2^{20}$ bits in an AWGN channel. Such a long code length is impractical in wireless communications, for example.

Assistant or error-detecting code (EDC) bits can be included in the input vector to assist in decoding. A cyclic redundancy check (CRC) code could be used as an EDC. More than one EDC could be used within one codeword. However, it should be understood that other EDCs, such as a checksum code or a Fletcher Code, may be used. Some EDCs are also error-correcting codes (ECCs).

CRC bits, for example, are generated based on the information bits being transmitted. CRC bits are generally placed in more reliable positions in the input vector, although CRC bits may also or instead be placed in other positions in the input vector. CRC bits may be used in path selection for List decoding, for example, to improve polar code performance. During encoding, an N-bit input vector could be formed from K information bits, including one or more CRC bits, and (N−K) frozen bits. In this example, starting with a number of input bits, a CRC is calculated and appended to the input bits to produce a set of information K bits including the input bits and the CRC bits. The remaining (N−K) frozen bits are inserted to produce an N-bit input vector, where N is a power of 2 in an Arikan polar code. The input vector is then multiplied by a generator matrix for a polar code to produce an N-bit codeword.

The codeword is transmitted over a channel, and a receiver, in turn, receives a word. Due to channel effects such as noise, the received word might not be identical to the transmitted codeword. A decoder attempts to decode the received word to determine information bits in the original input vector.

During decoding of a codeword encoded from an input vector, the locations and values of frozen bits in the input vector are treated as known. For descriptive simplicity, bits of the input vector that are not known to the decoder in advance will be referred to as "unknown" bits. For example, the information bits including any the CRC bits are unknown bits. Some polar decoders use SC decoding as noted above, in which the unknown bits are decoded sequentially and successive cancellation is applied. Once a particular decision has been made regarding how an unknown bit is to be decoded, SC polar decoders do not allow that bit to be changed or corrected, and the decoder moves on to decoding the next unknown bit.

An extension of SC polar decoding algorithm with better error correction performance, referred to as List or SCL decoding, is described in "List Decoding of Polar Codes" by Tal and Vardy, *Proceedings of the* 2011 *IEEE International Symposium on Information Theory*, pp. 1-5 (July 2011). In a List decoder, successive levels of a binary decision tree are generated, each level corresponding to a decision on a respective unknown bit. Each (decoding) path in the decision tree from the root node to leaf nodes represents a possible partial decoded sequence of unknown bits and has a corresponding likelihood. Typically, during generation of the decision tree, at each level of the decision tree where the number of paths grows beyond a set threshold L, the L paths having the highest likelihoods are identified, and the remaining paths are discarded. Some List decoders may also make use of CRC bits included in the codeword to assist in decoding. For example, if the codeword includes encoded CRC bits for the previous information bits, then once the decision tree is generated, each of the surviving paths that corresponds to decoded information bits is checked against the CRC bits represented in each of those surviving paths. The decoder then outputs as a decoded vector the information bits in the surviving path that passes the CRC check. If more than one path passes the CRC check, then the decoder selects for output the path that passes the CRC check and has the highest likelihood, which may be determined according to a metric. If no path passes the CRC check, or if the codeword does not include encoded CRC bits, then the decoder selects for output the path that has the highest likelihood, which as noted above may be determined according to a metric.

Thus, there are two types of the decoding based on successive cancellation, including SC decoding and List decoding, which is also referred to as SCL decoding. For every decoded bit, a decoding path generates 2 leaf branches (bit=0|1) for the next decoding bit. An SC decoder tracks only one decoding path. After the value of a decoded bit is estimated, the other possible value is ignored. Decoding continues with the next bit, assuming that each previous bit has been correctly estimated when updating partial sum results.

Figure 4:
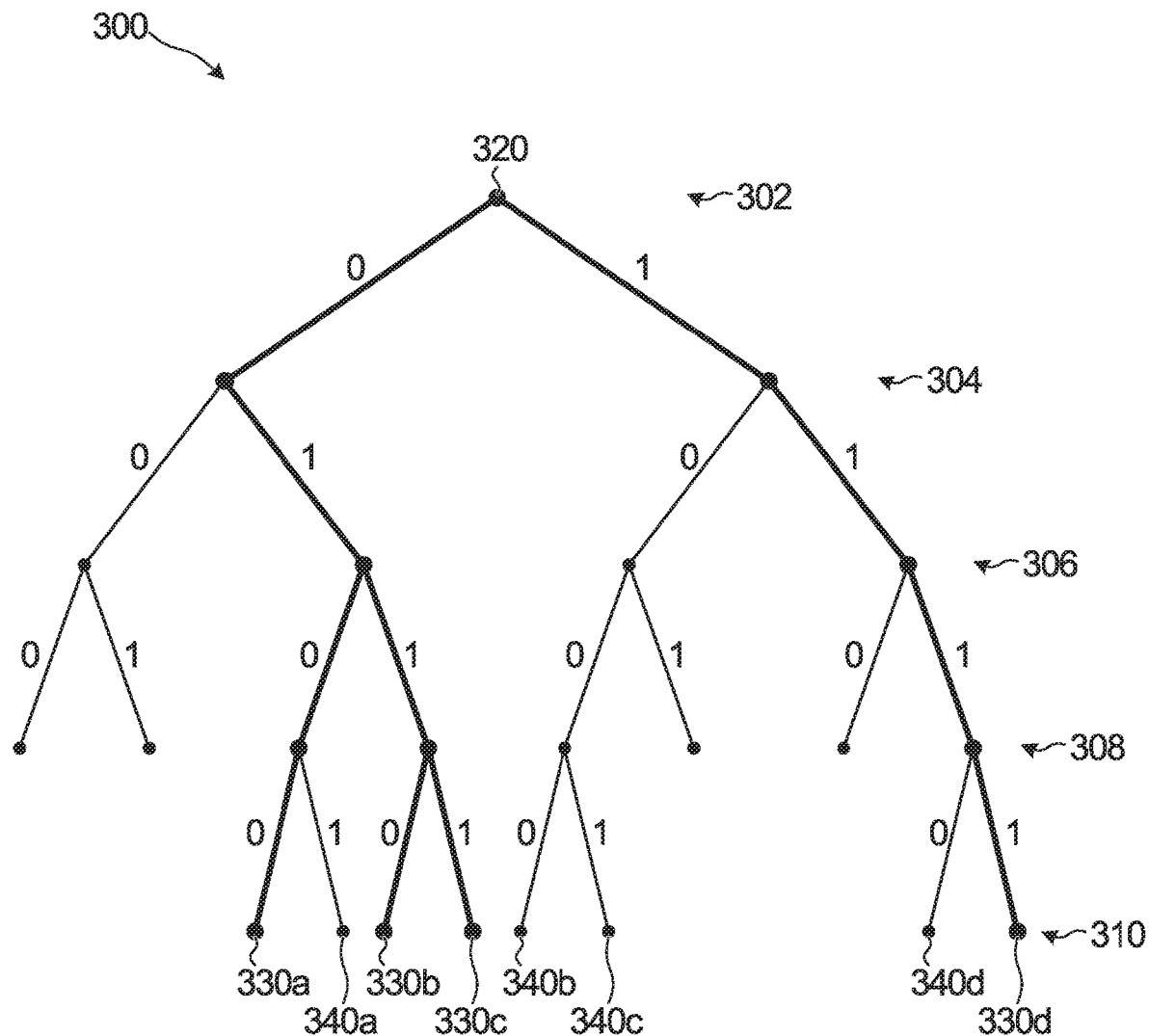
FIG. 4 is a diagram showing a portion of an example decision list tree whose width is limited by a maximum given list size and used in an SCL (Successive Cancellation List) polar decoder.

FIG. 4 is a diagram showing a portion of an example decision list tree 300 used in an SCL polar decoder, whose width is limited by a maximum given list size L. In FIG. 4 the list size L is 4. Five levels 302, 304, 306, 308, 310 of the decision tree are illustrated. Although five levels are illustrated, it should be understood that a decision tree to decode K information bits (including CRC bits) would have K+1 levels. At each level after the root level 302, each one of up to 4 surviving decoding paths is extended by one bit. The leaf or child nodes of root node 320 represent possible choices for a first bit, and subsequent leaf nodes represent possible choices for subsequent bits. The decoding path from the root node 320 to leaf node 330a, for example, represents an estimated codeword bit sequence: 0, 1, 0, 0. At level 308, the number of possible paths is greater than L, so L paths having the highest likelihood (e.g. best Path Metrics) are identified, and the remaining paths are discarded. The decoding paths that survive after the path sort at level 306 are shown in bold in FIG. 4. Similarly, at level 310, the number of possible paths is again greater than L, so the L paths having the highest likelihood (best PMs) are identified, and the remaining paths are again discarded. In the example shown, the paths terminating in leaf nodes 330a, 330b, 330c, and 330d represent the highest likelihood paths. The paths terminating in leaf nodes 340a, 340b, 340c, 340d are the lower likelihood paths which are discarded.

SCL decoding can be further divided into pure list decoding in which survivor paths with the highest likelihood are selected and CRC-Aided SCL (CA-SCL) decoding where CRC bits are used for path selection. SC decoding is a special case of pure list decoding, with list size L=1. A CRC may provide better error correction performance in the final path selection, but is optional in SCL decoding. Other decoding-assistant operations, such as a Parity Check (PC) based on parity or "PC" bits that are included in an input vector, could be used instead of or jointly with CRC bits in path selection during decoding or in the final path selection.

In an Additive White Gaussian Noise (AWGN) channel, a polar code in effect divides a channel into N sub-channels, where N is referred to as mother code length and is always is power of 2 in an Arikan polar code, which is based on a polar kernel that is a 2×2 matrix. A key to code construction for a polar code is to determine which bit-channels, also referred to herein as sub-channels, are selected or allocated for information bits and which sub-channels are allocated for frozen bits. In some embodiments, one or more sub-channels are also allocated to parity/PC, CRC, and/or other types of bits that are used to assist in decoding. In terms of polarization theory, the sub-channels that are allocated for frozen bits are called frozen sub-channels, the sub-channels that are allocated for information bits are called information sub-channels, and additional assistant sub-channels may be allocated to assistant bits that are used to assist in decoding. In some embodiments, assistant bits are considered to be a form of information bits, for which more reliable sub-channels are selected or allocated.

Figure 5:
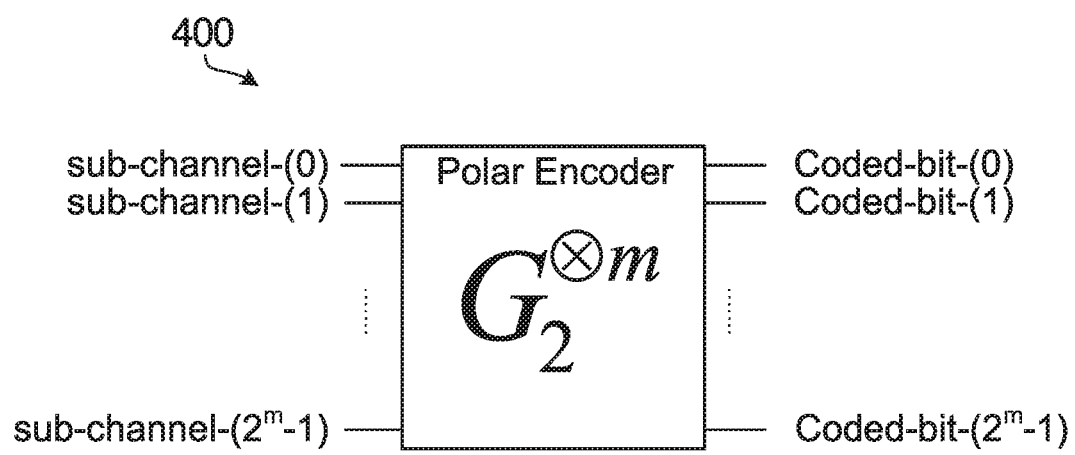
FIG. 5 is a block diagram illustrating an example of a polar encoder based on a 2-by-2 kernel.

Polar encoders based on Kronecker products of a 2-by-2 Arikan kernel $G_2$ are described above. FIG. 5 is a block diagram illustrating an example of a polar encoder 400 based on a 2-by-2 kernel. Sub-channels and coded bits are labeled in FIG. 5. A channel is divided into N sub-channels by a polar code as noted above. An information block and frozen bits are allocated onto the N sub-channels, and the resultant N-sized vector is multiplied with an N-by-N Kronecker matrix by the polar encoder 400 to generate a codeword that includes N coded bits. An information block includes at least information bits and could also include assistant bits such as CRC bits or PC bits. A sub-channel selector (not shown) could be coupled to the polar encoder 400 to select sub-channels for information bits and any assistant bits, with any remaining sub-channels being frozen sub-channels.

For polar codes that are based on a 2-by-2 kernel and an N-by-N Kronecker matrix, N is a power of 2. This type of kernel and polar codes based on such a kernel are discussed herein as illustrative examples. Other forms of polarization kernels with a different size (or number of inputs) could be generally characterized by code length $N=L^n$, where L is the dimension (i.e., size or number of inputs) of the applied kernel. In addition, polarization kernels such as other prime-number kernels (e.g. 3-by-3 or 5-by-5) or combinations of (prime or non-prime number) kernels to produce higher-order kernels could yield polarization among code sub-channels. It should also be noted that coded bit processing such as puncturing, shortening, zero padding, and/or repetition could be used in conjunction with polar codes that are based on 2-by-2 kernels or other types of kernels, for rate matching and/or other purposes for example.

As a result of SC, SCL, or CA-SCL decoding, the polarization phenomenon appears over these synthesized sub-channels. Some synthesized channels have high capacity, and some have low capacity. Put another way, some synthesized sub-channels have equivalently high Signal-to-Noise Ratio (SNR) and others have equivalently low SNR. These metrics are examples of characteristics that could be used to quantify or classify sub-channel "reliability". Other metrics indicative of sub-channel reliability could also or instead be used.

Code construction involves determining a code rate (the number of information bits K, or how many sub-channels are to carry information bits) and selecting the particular K sub-channels among the N available sub-channels that are to carry information bits. For ease of reference herein, information bits could include input bits that are to be encoded, and possibly CRC bits, PC bits, and/or other assistant bits that are used to assist in decoding. Sub-channel selection is based on reliabilities of the sub-channels, and typically the highest reliability sub-channels are selected as information sub-channels for carrying information bits.

Sub-channel reliabilities could be specified, for example, in one or more ordered sequences. A single, nested, SNR-independent ordered sequence of sub-channels could be computed for a code length $N_{max}$, with ordered sequences for shorter code lengths N being selected from the longer $N_{max}$ sequence. Multiple ordered sequences in terms of different mother code lengths $N_i$ could instead be computed, and one of the mother code length sequences could be selected for a particular code based on preferred code length. Another possible option involves computing multiple ordered sequences in terms of SNR values, for example, and selecting an ordered sequence based on measured SNR.

There are also several methods to compute sub-channel reliabilities. For example, Mori R, Tanaka T., "Performance and construction of polar codes on symmetric binary-input memoryless channels", IEEE International Symposium on Information Theory, 2009, 1496-1500, proposes a density evolution (DE) method in which the reliability of a sub-channel is measured using the decoding error probabilities of Belief Propagation decoding, which can be calculated via density evolution. The proposed method is proven to be capacity-achieving for arbitrary symmetric binary erasure channels when used for polar construction. However, because the method relies on iterative calculations of Log Likelihood Ratio (LLR) values for each sub-channel, it is computationally complex.

According to a genie-aided method proposed in E. Arikan, "Channel polarization: A method for constructing capacity-achieving codes for symmetric binary-input memoryless channels", IEEE Transactions on Information Theory, 2009, 55(7): 3051-3073, an encoder encodes on different sub-channels a training sequence that is known to the decoder. The decoder feeds back decoding results to the encoder so that the encoder can compute reliability statistics for every sub-channel, and a well-adapted reliability-vector over the sub-channels is obtained. The relative reliabilities for the sub-channels are dependent on the receiving SNR, making this method an SNR-dependent method.

Gaussian-approximation methods as proposed in J. Dai, K. Niu, Z. Si, J. Lin, "Evaluation and Optimization of Gaussian Approximation for Polar Codes", May 2016, and in P. Trifonov, "Efficient design and decoding of polar codes." IEEE Trans. on Communications 60.11 (2012): 3221-3227, assume that every coded bit is subjected to an equal error probability. From the error probability, the reliabilities over the sub-channels are obtained with a density evolution algorithm. Because this error probability on the coded bits is related to the receiving SNR, this method is also SNR-related and is computationally complex.

An SNR-independent polarization weight (PW) method is disclosed in R1-1611254, "Details of the Polar Code Design", Huawei & HiSilicon, 3GPP TSG RAN WG1 Meeting #87. In this method, the reliability of a sub-channel is measured by the corresponding beta-expansion values, which are given by a closed-form formula as a function of the binary representation of the sub-channel index. The reliability measure is SNR-independent, and can lead to a single nested ordered sub-channel sequence for different coding rates and block lengths. The sequence may be calculated offline and stored in memory for use, to provide a lower implementation and computational complexity relative to other methods.

As mentioned above, there are several ways to generate an ordered sequence (from a kernel and its generator matrix) via calculating the sub-channel reliabilities. Not every way might necessarily lead to a nested sequence, and this nested sequence might not necessarily be unique. Nested ordered sequences could be generated, for example, based on a polarization weight as disclosed in Chinese Patent Application No. CN 201610619696.5, filed on Jul. 29, 2016, or based on a Hamming weight as disclosed in U.S. Patent Application No. 62/438,565, filed on Dec. 23, 2016, both of which are entirely incorporated herein by reference. Other techniques could also or instead be used.

Ordered sequence computations can be performed in a number of different ways. For example, the computations could be performed online, producing ordered sequences that can be dynamically adjusted or recomputed based on, for example, observed channel conditions. The computations may alternatively be performed off line (i.e. in advance) to produce pre-computed (and static) ordered sequences that can be stored and retrieved during subsequent coding operations. In yet another alternative, the computations may be performed partially online and partially offline.

In mobile wireless communications, the channel conditions may significantly vary in time. It may be impractical to use online sequence computing methods with high computational complexity (e.g. genie-aided, DE and GA-based methods) because those methods may consume significant communication bandwidth and processing resources. Computationally complex methods, such as Genie-aided, DE and/or GA-based methods, are generally performed offline instead to produce multiple static ordered sequences, for example, by fixing a working SNR or reference SNR for different combinations of code length and code rate. However, simple online sequence generation methods such as those disclosed in U.S. Patent Application No. 62/463,128 entitled "APPARATUS AND METHODS OF SPECIFYING ORDERED SEQUENCES OF CODING SUB-CHANNELS" filed on Feb. 24, 2017 and incorporated herein by reference in its entirety may still be preferred, in that they generally consume less memory, and may be more flexible and adaptive to time-varying wireless channel conditions.

An Arikan code has been adopted for 5G NR control channel coding, as mentioned above. The selected code has better coding performance (about 2.0 dB gain) over TBCC for small block sizes.

An Arikan polar code with code length $N=2^n$ and a binary kernel $$F = \begin{bmatrix} 1 & 0 \\ 1 & 1 \end{bmatrix}$$

as described by way of example above is a linear block code generated by the row space of the generator matrix:

$$G_N = \begin{bmatrix} G_{N/2} & 0 \\ G_{N/2} & G_{N/2} \end{bmatrix} = F \otimes G_{N/2}.$$

Let $\mathcal{A}$ be a set of size K containing a subset of row indices of $G_N$. This set could be referred to as the information set. The complementary set $\mathcal{F}$ of size N−K could be referred to as the frozen set. Let $u=[u_1, \ldots, u_N]$ be an input bit vector. To encode a set of K information bits, the information bits are placed into those elements of u corresponding to the set $\mathcal{A}$, and deterministic zero-valued (or other known-valued) bits are placed into the remaining elements, corresponding to $\mathcal{F}$. Then a codeword $c=[c_1, \ldots, c_N]$ is calculated as $$c=uG_N.$$

Different decoding algorithms for Arikan polar codes are also described by way of example above. SC decoding is the simplest under which the capacity achieving property of polar codes is proven. Although polar codes are capacity-achieving under SC decoding, their performance at finite code length is not as promising. SCL decoding may improve performance at finite code length. CA-SCL decoding algorithms are also proposed for polar codes. Polar codes with CA-SCL decoding have emerged as strong competitors to Turbo and Low Density Parity Check (LDPC) codes.

The decoding complexity and latency of an Arikan polar code is directly related to list size of an SCL decoding implementation. The $3^{rd}$ Generation Partnership Project (3GPP) has assumed a maximum List size of 8 by allocating 3 extra CRC bits to guarantee a False-Alarm-Rate (FAR), of the NR-PDCCH channel, that is equal to a limitation on coding performance by a List-8 decoder.

The limitation is due primarily to the complexity and latency penalty paid for ranking L survivors from 2L candidate paths at each information bit. Complexity is O(2LK log(2L)) where L is list size and K is the number of information bits. Moreover, an SC-based decoder does not actually process information bits until L survival candidates are selected from the 2L candidates during decoding of any particular bit.

Due to this limitation, an Arikan polar code is proposed only for small blocks (smaller K) and is assumed to use an L<=8 decoder in current 5G NR standardization.

One solution to further enhance coding gain without increasing list size is to optimize an encoder. Encoder optimization could focus, for example, on a kernel in an effort to increase polarization, and/or on bit allocation for a rate-matching scheme in an effort to decrease the performance penalty associated with SCL decoding. However, any change to a polarization kernel would fundamentally reshape characteristics of a polar code, especially reliability distributions that are strongly relevant to allocation of K information bits on the K most reliable bit positions according to a rate-matching scheme. Some embodiments therefore relate to an optimization of the polarization kernel and its dynamic bit allocation.

Embodiments of the present disclosure could potentially be used in conjunction with polar coding, including "chained" polar coding using chained polar codes. Chained polar codes are also referred to as "convolutional" polar codes or Branching MERA codes. See, for example, A. J. Ferrus and D. Poulin, "Branching MERA codes: A natural extension of classic and quantum polar codes", in Proc. Intl Symp. Inf. Theory (ISIT) 2014, Honolulu, Hi., USA, June 2014.

Figure 6:
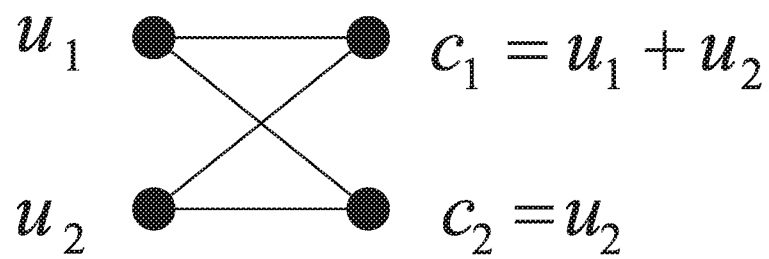
FIG. 6 is an example graph representation of a butterfly operation corresponding to a 2-by-2 Arikan kernel.
Figure 7:
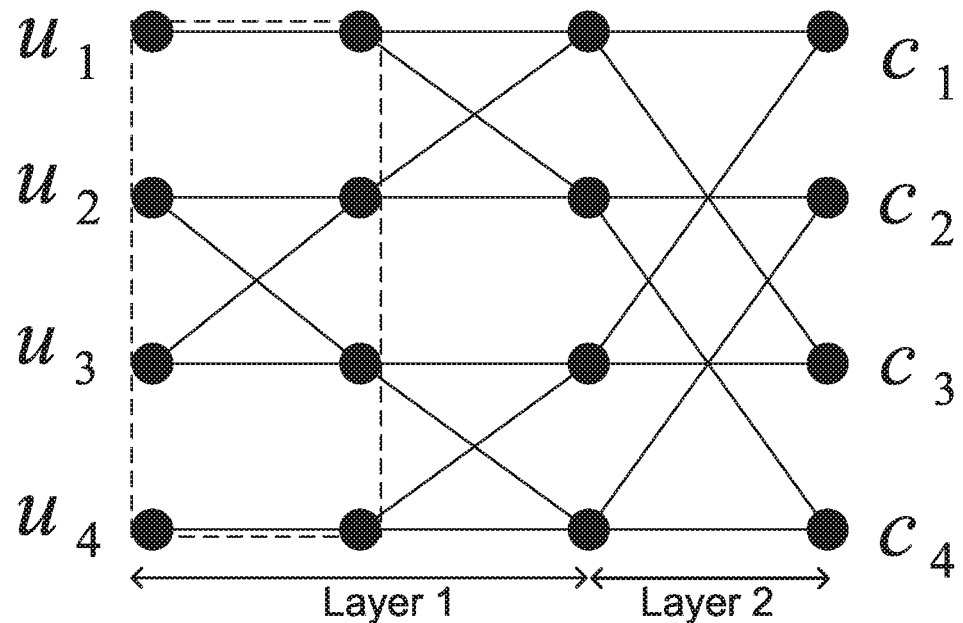
FIGS. 7-11 illustrate example coding graphs of chained polar codes of lengths 4, 8, 16, 32 and 64, respectively.
Figure 8:
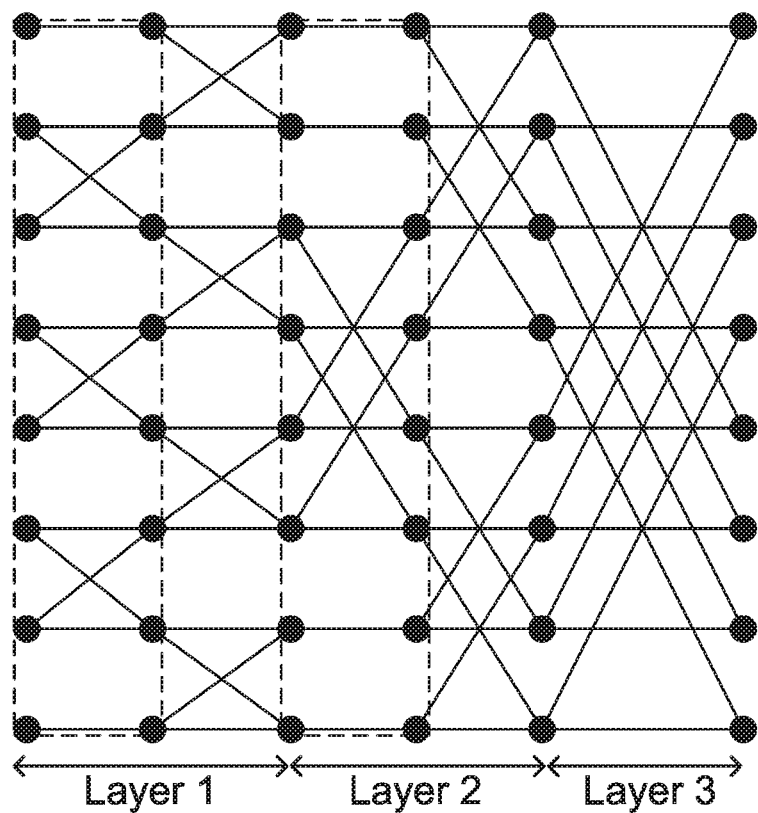
Figure 9:
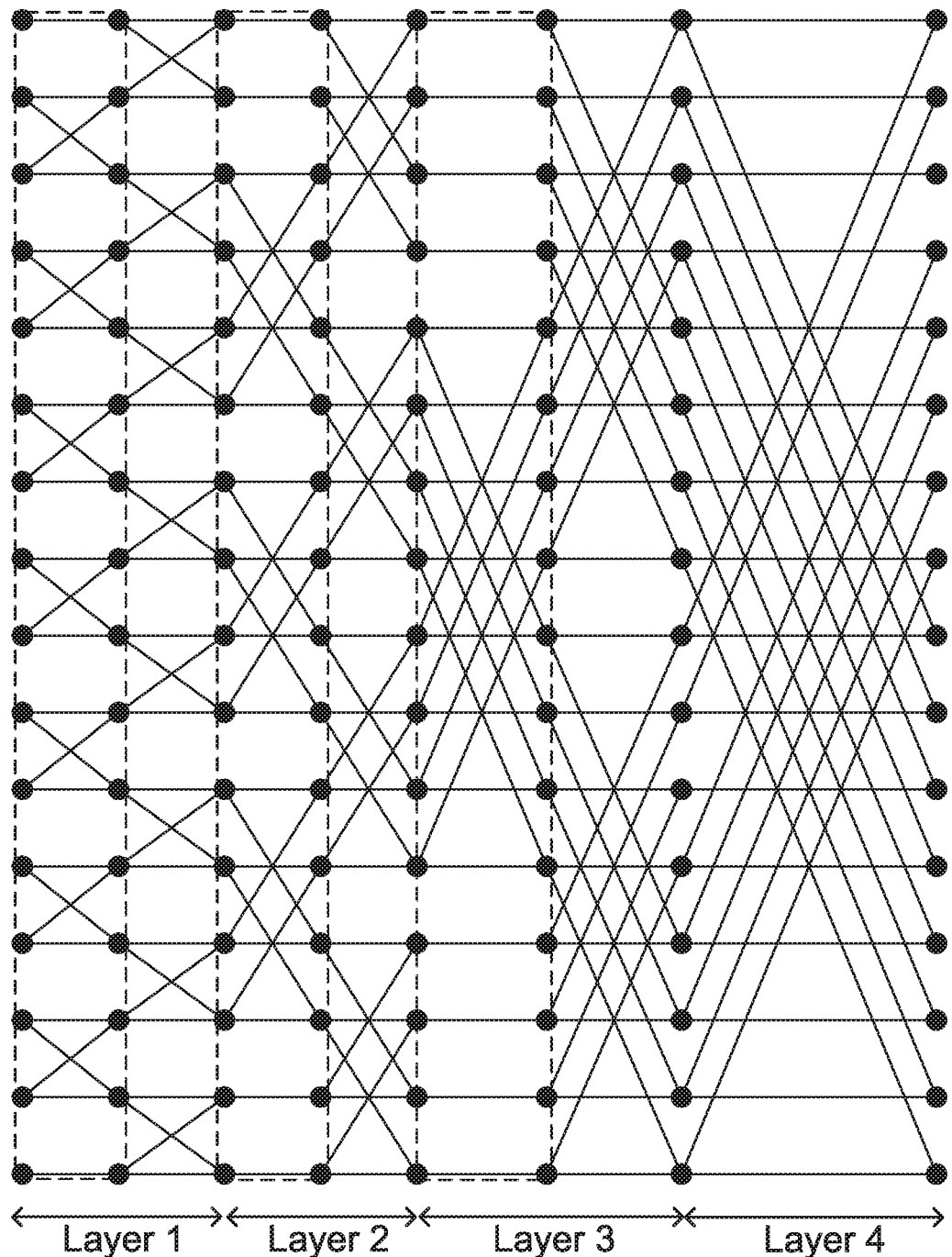
Figure 10:
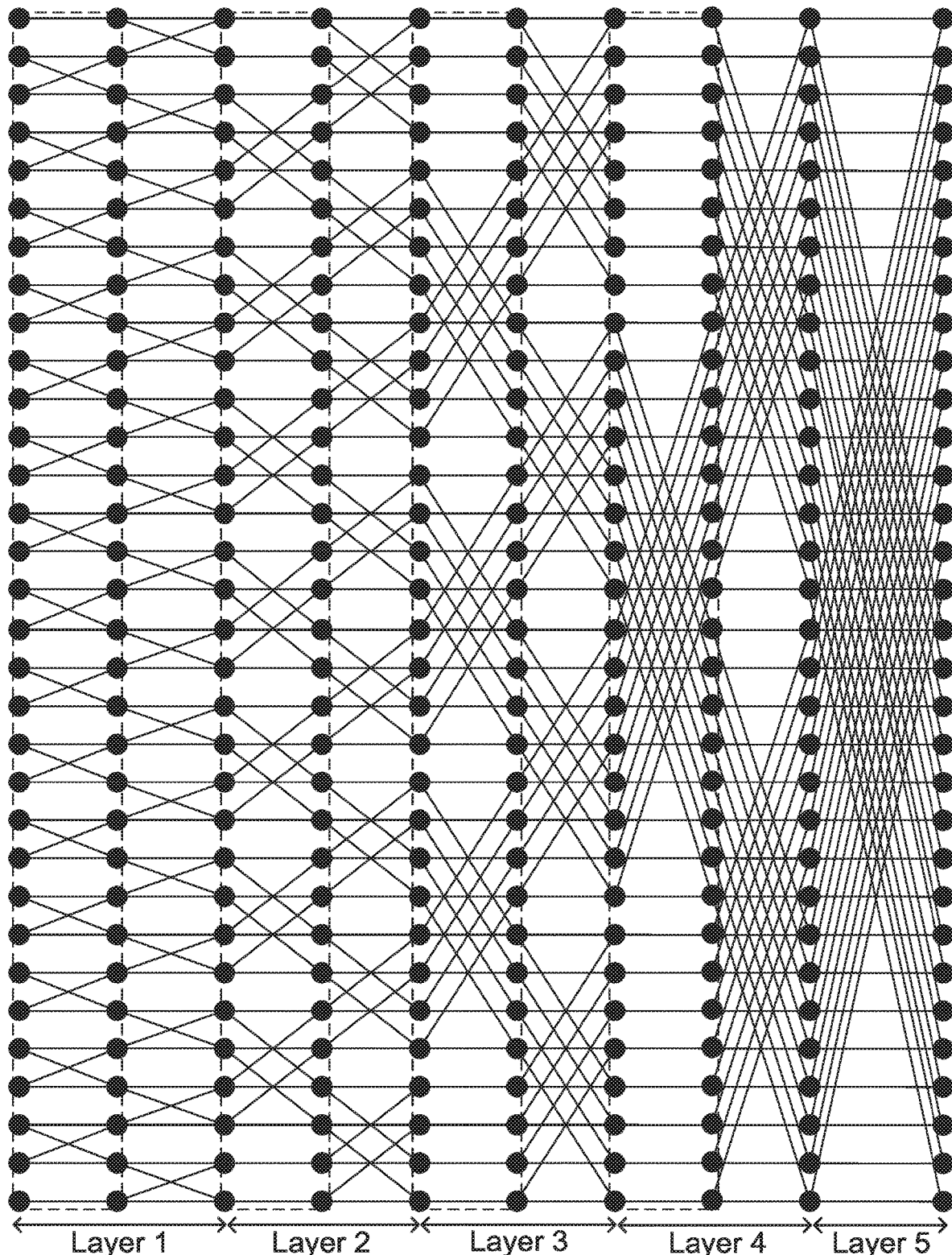
Figure 11:
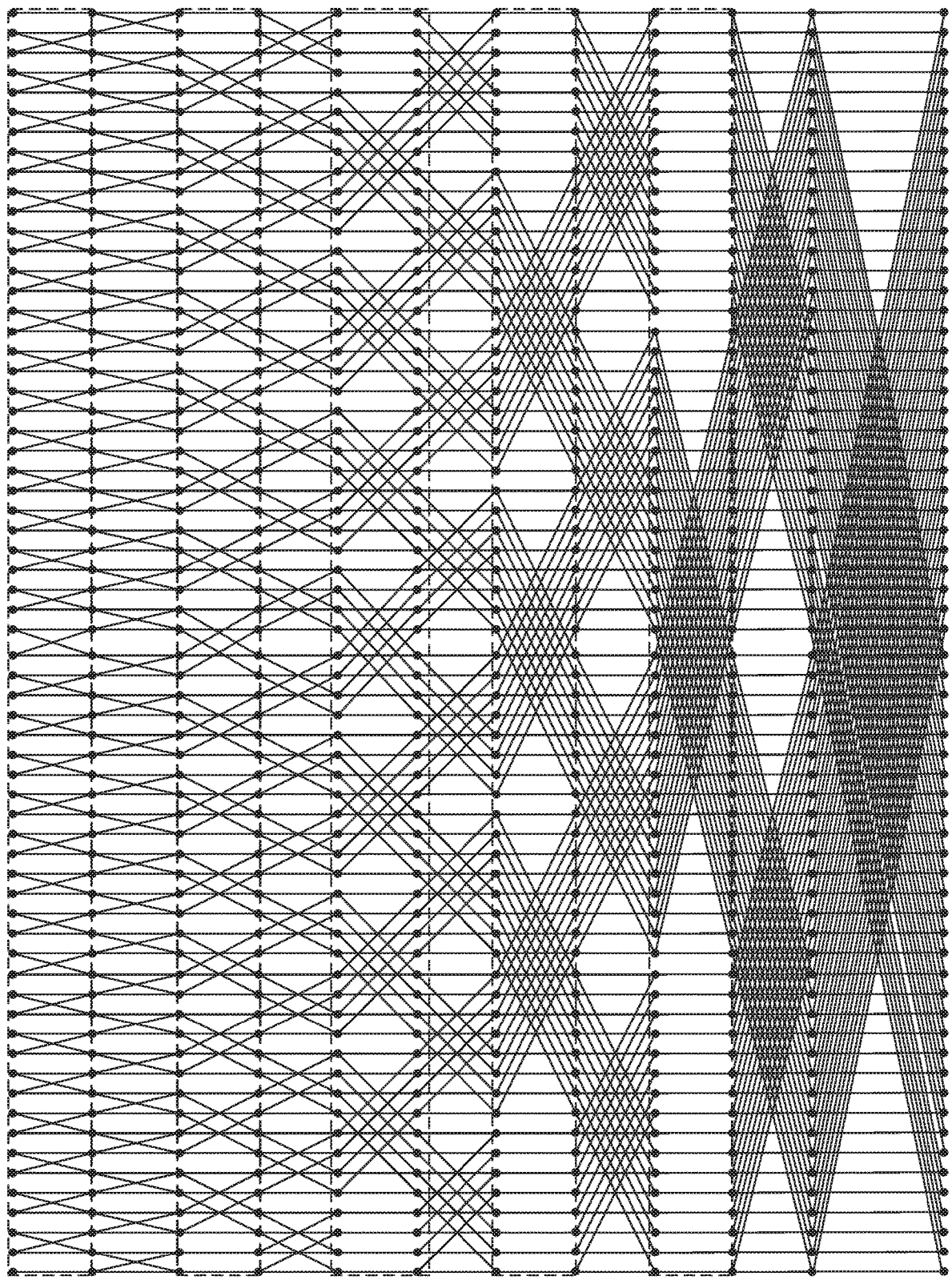

Kernel optimization in chained polar coding could be described in a graphical form by modifying a graph representation of an Arikan polar code to chain so-called "butterfly" shapes representing the 2×2 kernel $$F = \begin{bmatrix} 1 & 0 \\ 1 & 1 \end{bmatrix}$$

to each other. An example graph representation of a butterfly operation corresponding to a 2-by-2 Arikan kernel F is shown in FIG. 6.

A chained polar code encodes an input vector or block $u=[u_1, u_2, \ldots, u_N]$ using n encoding layers or stages, which are numbered from 1 to n in an embodiment. For a 2-by-2 kernel, $n=\log_2 N$, and more generally for an l-by-l kernel $n=\log_l N$. The encoding layers could be obtained, for example, by starting with encoding layers of a polar code and adding butterflies at the inputs of the layers such that they tie together two adjacent butterflies. For layer i, the first $2^{i-1}$ and the last $2^{i-1}$ bits are only copied to the input of the polar encoding layer. This operation is performed for all encoding layers except the last layer.

FIGS. 7-11 illustrate example coding graphs of chained polar codes of lengths 4, 8, 16, 32 and 64, respectively. The parts of these graphs within dashed lines are additional parts which, if removed, will provide graphs of Arikan polar codes.

These graphic representations illustrate that the number interconnections between bit positions is increased comparing to Arikan polar codes, including interconnections between bit positions in the upper half of each graph and those in the lower half of each graph, by layering several sets of interlocked kernels. Polarization is strengthened relative to an Arikan polar code. In fact, the exponent value of a chained polar code is much greater than that of an Arikan polar code, which is ½. Exponent value is indicative of polarization, with a higher exponent value indicating a higher degree of polarization.

Figure 12:
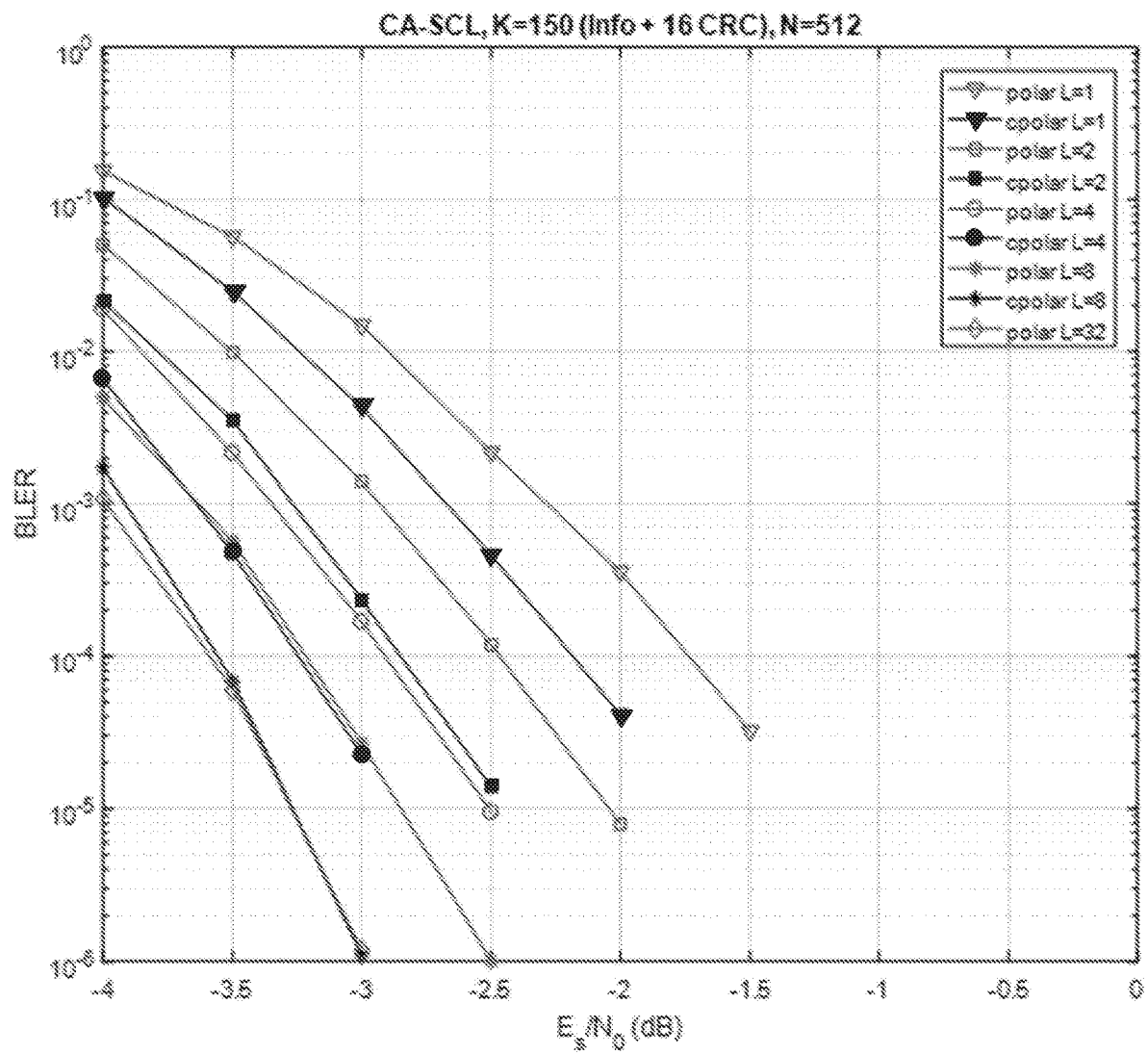
FIG. 12 is a plot of performance results from simulations.

Simulations show significant performance gain for chained polar codes versus Arikan polar code for the same list sizes. Chained polar codes could outperform Arikan polar codes across different coding rates under both SC and CA-SCL decoding, for example. FIG. 12 is a plot of performance results from simulations, for Arikan polar codes and chained polar codes (labeled as "cpolar" in FIG. 12). Simulation conditions are listed in FIG. 12. Similar or different results might be observed under different simulation conditions, and/or under similar or different operating conditions.

Arikan polar codes and chained polar codes are both shown to have promising error control performance. The generator matrices $G_N$ of both types of codes could be constructed recursively from generator matrices of smaller length, such as $G_{N/2}$. While recursion is sufficient to describe $G_N$ in terms of $G_{N/2}$ for Arikan polar codes, for chained polar codes additional matrices are introduced to complete the code construction. As can be seen from the graphical representations of chained polar codes in FIGS. 7-11, these additional matrices in general play the role of "chaining" the butterflies in Arikan polar codes together, and therefore can be considered to have a chaining effect.

A unified coding method using chained polar codes, with generator matrices that involve chaining and could also involve recursion, may be expected to have superior performance compared to current coding schemes. In the present disclosure, such a coding method and related embodiments are described.

The generator matrix of an Arikan polar code $G_N = F^{\otimes n}$ can be also written as $$G_N = \begin{bmatrix} G_{N/2} & 0 \\ G_{N/2} & G_{N/2} \end{bmatrix}.$$

The generator matrix of chained polar codes of length $N=2n$ based on a 2-by-2 kernel can be written as $$G_N = \begin{bmatrix} G_{N/2} & 0 \\ (F^{\otimes(n-1)})^T G_{N/2} & G_{N/2} \end{bmatrix},$$

where $G_2 = F$, and T is the matrix transpose operator. The matrix $(F^{\otimes(n-1)})^T$ is a chaining matrix in this example and introduces the chaining effect to the encoding graph of an Arikan polar code, resulting in the encoding graph of a chained polar code. On the other hand, if this matrix were to be replaced by the identity matrix, then this results in the generator matrix of Arikan polar codes. Numerical analysis has shown that introducing $(F^{\otimes(n-1)})^T$ into the generator matrix of Arikan polar codes increases the distance properties of the code, resulting in an improved distance spectra of chained polar codes over Arikan polar codes. Chaining in chained polar codes also results in stronger polarization of the bit-channels.

Generator matrices for chained polar codes could be constructed in two steps. A first step is defined based on a polar code construction with a kernel matrix F of size $z \times z$ defined over a Galois field GF(q). By this step, a generator matrix of size $z^n$ could be constructed recursively as $$G_N^{(r)} = F \otimes G_{N/z}^{(r)},$$

where $G_z^{(r)} = F$. This matrix is obtained by replacing each nonzero element of F by $G_{N/z}^{(r)}$ and each zero element by an all-zero matrix. Consider the following 3×3 matrix (z=3) as an example:

$$F = \begin{bmatrix} 1 & 0 & 0 \\ 0 & 1 & 0 \\ 1 & 1 & 1 \end{bmatrix}.$$

Then $$G_N^{(r)} = \begin{bmatrix} G_{N/3}^{(r)} & 0 & 0 \\ 0 & G_{N/3}^{(r)} & 0 \\ G_{N/3}^{(r)} & G_{N/3}^{(r)} & G_{N/3}^{(r)} \end{bmatrix}.$$

The generator matrix of a chained polar code with code block length $N=2^n$, can also be written as $$G_N = C_N \begin{bmatrix} G_{N/2} & 0 \\ 0 & G_{N/2} \end{bmatrix} P_N,$$

where $G_2 = F$, and $C_N$ and $P_N$ are defined below.

$P_N = [p_{i,j}]$ is a permutation matrix defined as $p_{\pi(j),j} = 1$ where $$\pi(j) = \begin{cases} \dfrac{j+1}{2} & j \text{ odd} \\ \dfrac{N+j}{2} & j \text{ even} \end{cases}.$$

Let $R_j$ denote a set of row indices for which $C_N$ is not zero at column j. We then have $$R_j = \{2j+1, 2j, 2j+1\} \text{ for } j = 1 \ldots, \frac{N}{2} - 1,$$

$$R_{\frac{N}{2}} = \{N-1, N\}, R_j = \{2j-N, 2j-N+1\},$$

$$j = \frac{N}{2} + 1, \ldots, N-1 \text{ and } R_N = \{N\}.$$

The generator matrix $G_N$ can be also described in terms of a graphical structure by modifying that of an Arikan polar code by chaining the butterfly shapes representing the 2×2 kernel $$F = \begin{bmatrix} 1 & 0 \\ 1 & 1 \end{bmatrix}$$

to each other.

Although this step is defined recursively in that a generator matrix of size N is based on a smaller generator matrix, it should be appreciated that recursion does not necessarily involve multiple iterations. For example, the smaller matrix, which is $G_{N/3}^{(r)}$ above, could be stored in memory or otherwise accessible to an encoder, and a larger generator matrix could be constructed in a single iteration.

Another operation could be referred to as a chaining step or operation, in which an additional matrix, also referred to herein as a chaining matrix, is applied to a base generator matrix $G_N^{(r)}$ by multiplying certain non-zero entries or elements in the base generator matrix by the chaining matrix, denoted by $C_{N/z}$ herein for ease of reference and then replacing $G_N^{(r)}$ by $G_N$ in the final formula. For example, a chaining matrix $C_{N/3}$ could be applied to the above base generator matrix $G_N^{(r)}$ by multiplying the first two $G_{N/3}^{(r)}$ entries in the third row of $G_N^{(r)}$ by the chaining matrix $C_{N/3}$, resulting in a generator matrix $$\begin{bmatrix} G_{N/3}^{(r)} & 0 & 0 \\ 0 & G_{N/3}^{(r)} & 0 \\ C_{N/3}G_{N/3}^{(r)} & C_{N/3}G_{N/3}^{(r)} & G_{N/3}^{(r)} \end{bmatrix}.$$

Replacing $G_{N/3}^{(r)}$ in the above formula by $G_{N/3}$ we will have the final generator matrix $$G_N = \begin{bmatrix} G_{N/3} & 0 & 0 \\ 0 & G_{N/3} & 0 \\ C_{N/3}G_{N/3} & C_{N/3}G_{N/3} & G_{N/3} \end{bmatrix}.$$

A chaining matrix is applied to only certain entries in a base generator matrix. Selection of the particular entries to which the chaining matrix is to be applied could be determined, for example, based on target row weights in the final generator matrix. Entry selections could also or instead be determined based on other parameters, and/or using techniques such as numerical analysis.

In general, once the positions in the base generator matrix $G_N^{(r)}$ are selected, the entries $G_{N/Z}^{(r)}$ in those positions are multiplied by the chaining matrix $C_{N/Z}$. Different options for carrying out this type of code construction are presented below.

For a 2×2 kernel $$F = \begin{bmatrix} 1 & 0 \\ 1 & 1 \end{bmatrix},$$

consider a chaining matrix: $C_N = I_N$ for illustrative purposes. With this chaining matrix, a chaining operation constructs the following for an Arikan polar code $$G_N = \begin{bmatrix} G_{N/2} & 0 \\ G_{N/2} & G_{N/2} \end{bmatrix}.$$

With a chaining matrix: $C_N = (F^{\otimes n})^T$ and $N = 2^n$, however, a chaining operation in which the lower left position is selected constructs the following $$G_N = \begin{bmatrix} G_{N/2} & 0 \\ (F^{\otimes (n-1)})^T G_{N/2} & G_{N/2} \end{bmatrix}.$$

For a 4×4 kernel $$F = \begin{bmatrix} 1 & 1 & 1 & 0 \\ \alpha & \alpha^2 & 1 & 0 \\ \alpha^2 & \alpha & 1 & 0 \\ 1 & 1 & 1 & 1 \end{bmatrix}$$

where $\alpha$ is the primitive element of GF(4). and a chaining matrix: $C_N = I_N$ and $N = 4^n$, a chaining operation constructs the following $$G_N = \begin{bmatrix} G_{N/4} & G_{N/4} & G_{N/4} & 0 \\ \alpha G_{N/4} & \alpha^2 G_{N/4} & G_{N/4} & 0 \\ \alpha^2 G_{N/4} & \alpha G_{N/4} & G_{N/4} & 0 \\ G_{N/4} & G_{N/4} & G_{N/4} & G_{N/4} \end{bmatrix}.$$

With a chaining matrix: $C_N = (F^{\otimes n})^T$ and $N = 4^n$, a chaining operation in which positions in the first three columns are selected constructs the following $$G_N = \begin{bmatrix} G_{N/4} & G_{N/4} & G_{N/4} & 0 \\ \alpha G_{N/4} & \alpha^2 G_{N/4} & C_{N/4}G_{N/4} & 0 \\ \alpha^2 G_{N/4} & \alpha C_{N/4}G_{N/4} & G_{N/4} & 0 \\ C_{N/4}G_{N/4} & G_{N/4} & G_{N/4} & G_{N/4} \end{bmatrix}.$$

These are intended to be illustrative examples of constructing generator matrices for chained polar codes. For example, the present disclosure is not limited to applying $C_{N/4}$ only to the positions indicated above. $C_{N/4}$ could also or instead be applied to entries at other positions in other embodiments, such as the entries at positions (row, column)=(4,1), (4,2) and (2,3).

Chained polar codes could be designed in other ways as well. For example, U.S. patent application Ser. No. 15/875,403 filed on Jan. 19, 2018 and entitled "APPARATUS AND METHODS FOR POLAR CODE CONSTRUCTION AND BIT POSITION ALLOCATION", and U.S. Provisional Patent Application No. 62/634,278 filed on Feb. 23, 2018 and entitled "APPARATUS AND METHODS FOR POLAR CODE CONSTRUCTION AND CODING", provide further of chained polar coding which could be implemented in conjunction with embodiments of the present disclosure. The entire contents of these applications are incorporated herein by reference.

Due to their superior performance relative to polar codes without rate matching, cpolar codes are an attractive class of channel codes for possible use in future commercial communication systems. Rate matching can be an integral part of a practical system, and therefore developing rate matching apparatus and methods for cpolar codes is of significant importance. Although some rate matching techniques for polar codes could be directly applied to cpolar codes, performance under such rate matching might not be maintained for cpolar codes. Furthermore, puncturing code bits affects the reliabilities or capacities of certain sub-channels, to an extent that some sub-channels will have such low reliability or capacity (e.g. zero) that they may effectively become "disabled".

In some embodiments, a disabled sub-channel has a reliability and/or capacity that is lower than a reliability/capacity of sub-channels used to carry bits that can actually be decoded at a receiver. In other embodiments, sub-channels with a reliability or capacity such that the bits they carry cannot practically be decoded could be considered disabled. Although information bits could be placed on one or more disabled sub-channels, in yet other embodiments, this may result in worse performance than a comparable code in which fewer disabled sub-channels, or no disabled sub-channels at all, were selected as information sub-channels.

Unlike polar codes, finding the relationship between a set of punctured code bits and disabled sub-channels for cpolar codes is not an easy task. An interesting problem is to find rate matching techniques that are applicable to cpolar codes.

In some rate matching embodiments for cpolar codes, sub-channels that are affected most by puncturing (e.g. disabled sub-channels) could be identified and excluded from the sub-channels used for the information set. In other embodiments, the sub-channels so identified could be set as "disabled" or treated as frozen bit sub-channels (e.g. included in the set of sub-channels used for frozen bits). In any event, Cpolar rate matching need not necessarily be specific only to cpolar codes, but could also be applicable to other types of polar codes such as Arikan polar codes.

In an embodiment, rate matching is used to construct a (K, M, N) code, where K is information block length, M is the code block length after rate matching and $N=2^n$ is the mother code length. Consider a cpolar code of length N and puncturing of one code bit. Puncturing this code bit will cause one of the sub-channels to be disabled, and have a zero capacity. If additional code bits are punctured, to have P punctured code bits in total, then exactly P sub-channels will become disabled. In other words, for a set $\mathcal{P}$ of punctured code bit indices $\mathcal{P} \subset \{1, 2, \ldots, N\}$ and a set $\mathcal{D}$ of disabled sub-channel indices $\mathcal{D} \subset \{1, 2, \ldots, N\}, |\mathcal{D}|=|\mathcal{P}|=P$. Unlike polar codes, finding a relationship between the set of punctured code bits $\mathcal{P}$ and the set of disabled sub-channels $\mathcal{D}$ is not always an easy task.

With block puncturing or natural order puncturing in which the first P code bits are purchased, $\mathcal{P} = \{1, 2, \ldots, P\}$, it can be shown the set of disabled sub-channels will be $\mathcal{D} = \mathcal{P}$. With another puncturing method that punctures the last P code bits, $\mathcal{P} = \{N-P+1, \ldots, N\}$, the set D can be shown to be $\mathcal{D} = \{1, \ldots, P\}$. These two puncturing methods are shown in FIGS. 13 and 14 for a cpolar code of length N=16 and P=8.

Figure 13:
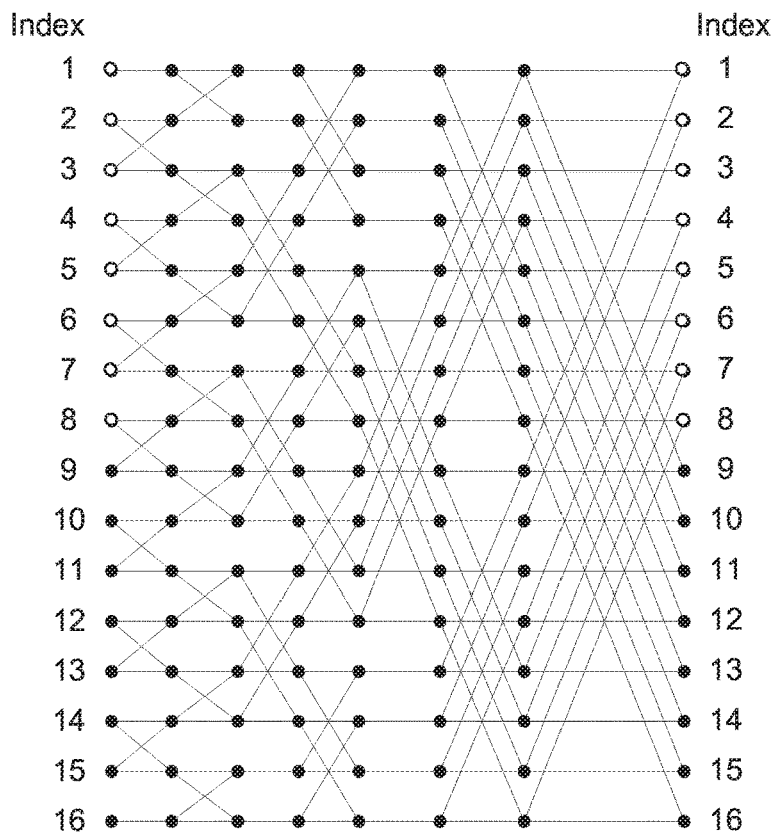
FIGS. 13 and 14 are graph representations of block puncturing in an example chained polar code.

In FIG. 13, there are 8 punctured code bits depicted by white circles in the rightmost column and 8 disabled information bits (sub-channels) in the leftmost column, also denoted by white circles. The block puncturing in this example punctures a contiguous block of code bits, starting from the first code bit, in a natural order of the code bits. Natural order refers to a sequence of bits (or sub-channels) in order of bit or sub-channel index. In FIG. 13, for N=16, and code bit indices from 1 to 16 are shown at the right-hand side of the drawing. Input bit position indices or sub-channel indices from 1 to 16 are similarly shown at the left-hand side of FIG. 13. Indices need not necessarily start with the number 1, and in the examples of FIG. 13 indices could range from 0 to 15, for example. It should also be noted that natural order could be in increasing or decreasing order of indices.

For the block puncturing shown in FIG. 13, $\mathcal{P} = \{1, \ldots, P\} \to \mathcal{D} = \{1, \ldots, P\}$, or more specifically $\mathcal{P} = \{1, \ldots, 8\}$ and $\mathcal{D} = \{1, \ldots, 8\}$. The punctured code bits are code bits 1 to 8 and the disabled input bit positions, information bits, or sub-channels, which would preferably be frozen for best code performance, are at indices 1 to 8.

Figure 14:
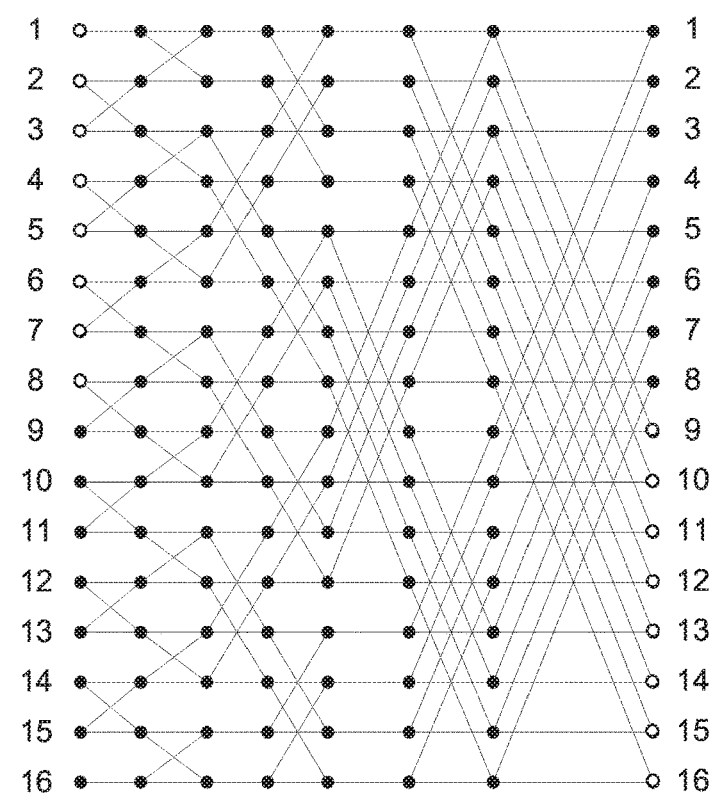

The block puncturing in FIG. 14 is in reverse order, starting from the $N^{th}$ code bit, index N in the example shown. There are 8 punctured code bits 9 to 16 depicted by white circles in the rightmost column and 8 disabled input bit positions, information bits, or sub-channels 1 to 8 depicted by the white circles in the leftmost column. Such block puncturing starting from the last code bit can be generally described as $\mathcal{P} = \{N-P+1, \ldots, N\} \to \mathcal{D} = \{1, \ldots, P\}$, or in the example shown in FIG. 14, $\mathcal{P} = \{9, \ldots, 16\}$ and $\mathcal{D} = \{1, \ldots, 8\}$.

Rate matching according to an embodiment of the present disclosure could be referred to as "start-end" (SE) rate matching. To construct a (K, M, N) cpolar codes using SE rate matching, a design parameter S is introduced. S denotes a number of code bits to be punctured via block puncturing. That is, the first S code bits starting from the first code bit in a natural order of the code bits are punctured. Given the total number of code bits P to be punctured for rate matching (e.g., P=N−M), rate matching might involve selecting E=P−S additional code bits to puncture. These additional code bits are chosen according to reverse block puncturing, in which the last E code bits according to a natural order of the code bits are punctured. The particular sub-channels that become disabled as a result of this puncturing, or the disabled set D, can then be determined. In this example S is used as a coding parameter to specify a number of code bits to be punctured via block puncturing. E could be used as a coding parameter in other embodiments, to specify a number of code bits to be punctured via reverse block puncturing, and used in determining S=P−E.

In determining the disabled set $\mathcal{D}$, it is noted that in general if one code bit is added to the punctured set, then exactly one sub-channel will be added to the disabled set. Since puncturing the first S code bits makes the first S sub-channels disabled and puncturing the last E code bits makes the first E sub-channels disabled in the natural order of code bits and sub-channels, the disabled set for SE rate matching will include the first max(S, E) sub-channels in the natural order of the sub-channels. Investigation by the present inventors shows that the additional disabled sub-channels can be obtained by disabling a certain number (zero or more) of adjacent sub-channels that appear in natural order after the first max(S, E) sub-channels and then choosing the remaining disabled sub-channels from those with even indices. In other words, for SE puncturing $\mathcal{P} = \{1, \ldots, S\} \cup \{N-E+1, \ldots, N\}$, and the disabled set can be written as $\mathcal{D} = \{1, 2, \ldots, D, D+2, D+4, \ldots, 2P-D\}$, where D≥max(S, E).

That is, the first D sub-channels will be disabled and the next P−D disabled sub-channels are chosen from those following the first D sub-channels in the natural order of sub-channel indices by only choosing even-index sub-channels. In other words, starting from the first sub-channel, D consecutive sub-channels are disabled. Then starting from sub-channel D+2, a total of P−D even-index sub-channels, which may be consecutive even-index sub-channels, are disabled. D is determined based on P and S and could be stored in a table for different code parameters, for example.

Figure 15:
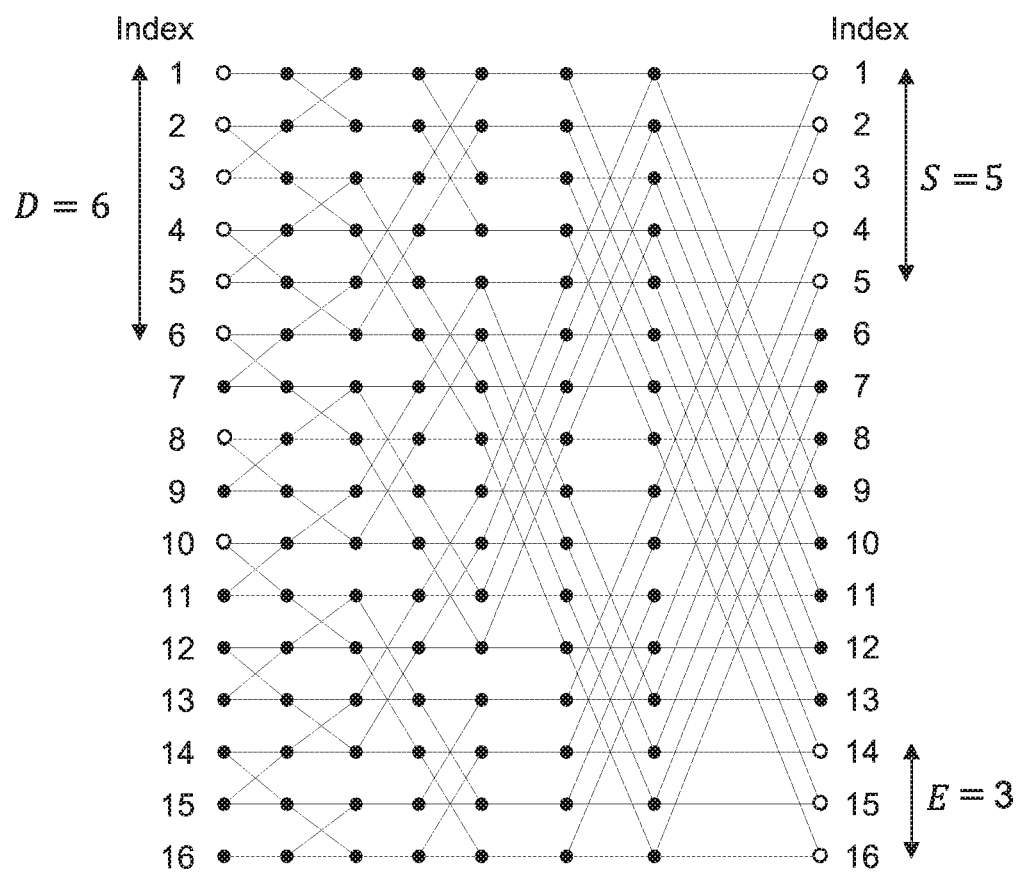
FIG. 15 is a graph representation of puncturing in an example chained polar code, according to an embodiment.

FIG. 15 is a graph representation of SE puncturing, for an example chained polar code in which N=16 and P=8. In FIG. 15, S=5, E=P−S=3, D=6 and $\mathcal{P} = \{1, \ldots, 5\} \cup \{14, \ldots, 16\} \to \mathcal{D} = \{1, \ldots, 6\} \cup \{8, 10\}$.

Figure 16:
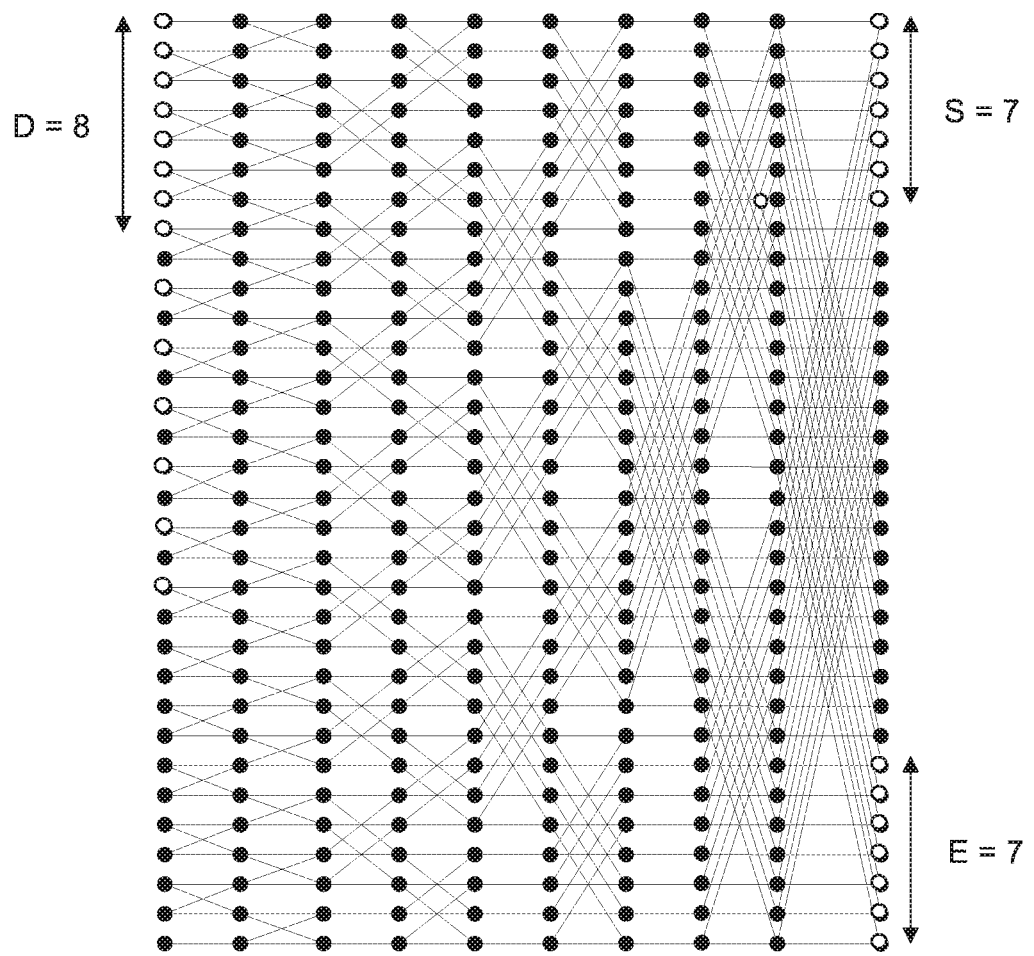
FIG. 16 is a graph representation of another embodiment of puncturing in a further example chained polar code.

FIG. 16 is a graph representation of another embodiment of puncturing in a further example chained polar code, in this case a length-32 cpolar code. There are 14 punctured code bits depicted by white circles in the rightmost column and 14 disabled input or information bits (sub-channels) in the leftmost column depicted by white circles. Thus, N=32, P=14, S=7, E=P−S=7. In this example, D=8 and ={1, ..., 7}∪{26, ..., 32}→$\mathcal{D}$ ={1, ..., 8}∪{10, 12, 14, 16, 18, 20}.

Rate matching by puncturing as disclosed herein could be used to construct cpolar codes, and possibly other types of polar codes such as Arikan polar codes, with different code configurations. As an illustrative example, suppose that a (K, M, N) cpolar code is to be constructed, where K is the information block length, M is the code block length after rate matching and N=$2^n$ is the mother code length, and a sub-channel reliability sequence $Q_N=\{q_1, q_2, \ldots, q_N\}$ specifying sub-channel reliabilities is available. Code construction could then proceed as follows:

Step 1) Determine the number of punctured code bits P=N−M

Step 2) Determine the number of natural order block punctured bits S, according to K and M, S=S(K, M), in an embodiment. As an example, S could be determined using a table specifying the value of S for different ranges of K|M. Having determined S, the number of reverse natural order block punctured bits can be determined as E=P−S. Alternatively, E could be determined first, as a function E=E(K, M) for example, and then S could be determined as S=P−E.

Step 3) Determine the number of consecutive disabled sub-channels D from S and E, D=D(S, E). A table could be stored to implement this function.

Step 4) Determine the set of disabled sub-channels $\mathcal{D}$ as
$\mathcal{D} =\{1, 2, \ldots, D, D+2, D+4, \ldots, 2P−D\}$ Step 5) Determine the information set $\mathcal{A}$ by selecting K most reliable sub-channels according to Q, starting from $q_N$, $q_{N-1}, \ldots$, and skipping the indices specified in the disabled set $\mathcal{D}$, if the entries in Q are arranged in increasing reliability order from 1 to N. The frozen set $\mathcal{F}$ is the complementary set $\mathcal{F} =\{1, \ldots, N\}\backslash\mathcal{A}$ where \ is the set difference operator. The set of punctured code bits has also been determined as $\mathcal{P} =\{1, 2, \ldots, S\}\cup\{N−E+1, N−E+2, \ldots, N\}$. In another embodiment, the entries in Q are arranged in decreasing reliability order and the selection of the most reliable sub-channels starts from the first entry in Q. Some embodiments could involve determining the frozen set, for example by selecting at least some, and for better code performance all, of the sub-channels in $\mathcal{D}$, and then selecting any further frozen sub-channels in increasing reliability order according to Q.

Figure 17:
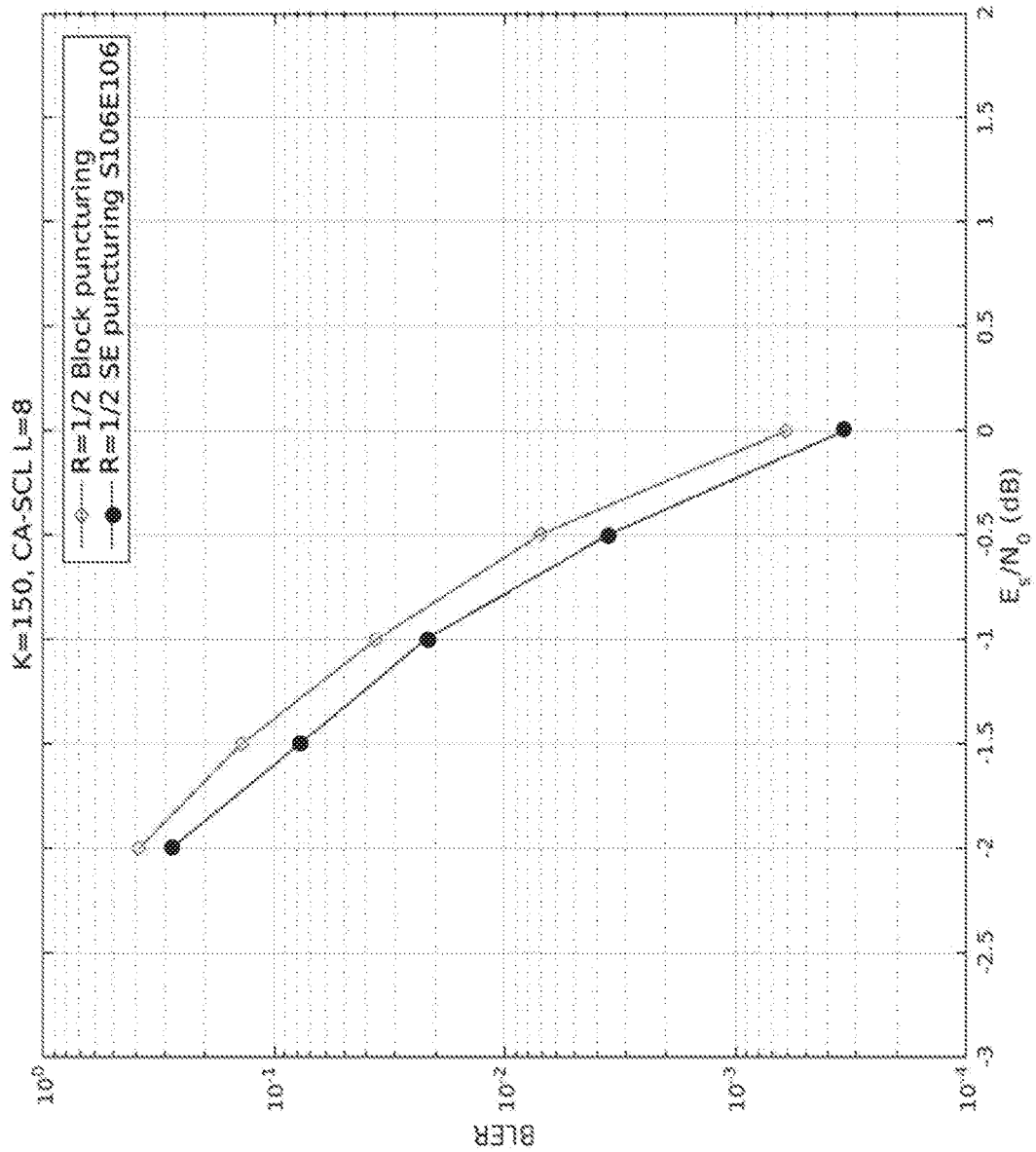
FIG. 17 is another plot of performance results from simulations.

FIG. 17 is another plot of performance results from simulations, and illustrates superior performance for SE puncturing with K=150, M=300, N=512, S=106 and E=106. Similar or different results might be observed under different simulation conditions, and/or under similar or different operating conditions.

Figure 18:
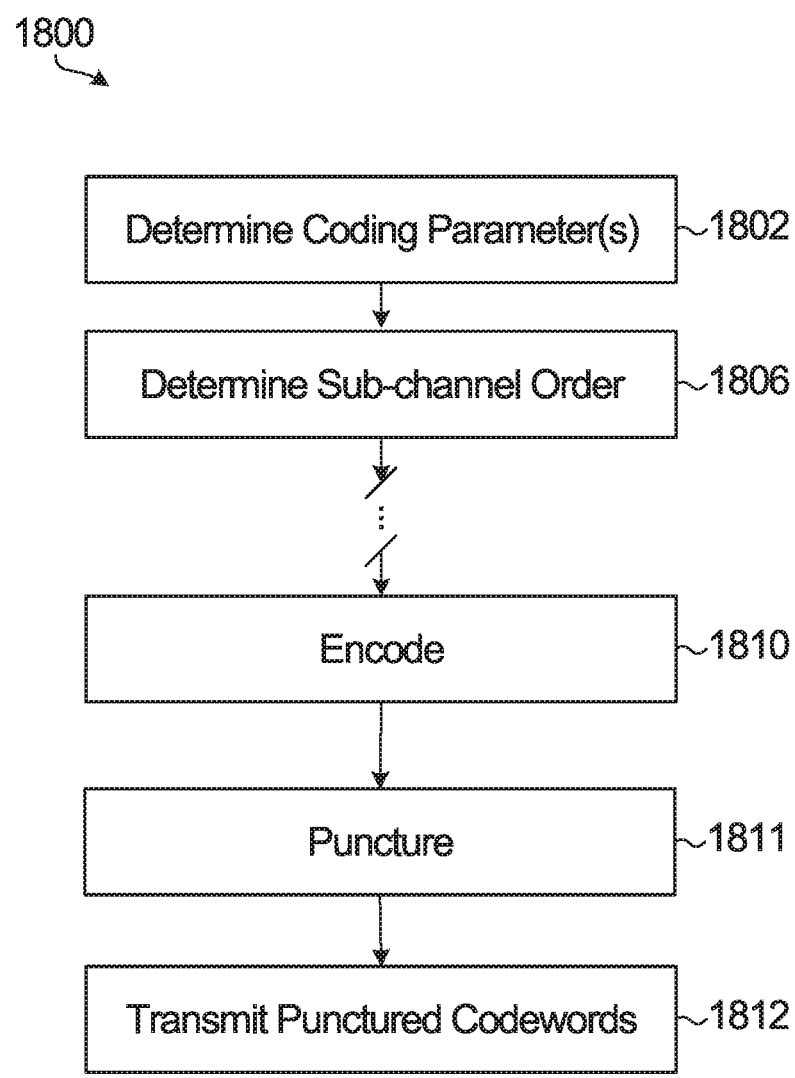
FIG. 18 is a flow diagram of an example coding method according to an embodiment.

FIG. 18 is a flow diagram of an example coding method according to an embodiment. The illustrated example method 1800 includes determining one or more coding parameters at 1802. The coding parameter(s) could include, for example, mother code length N, a number of information bits K, a code block length M after rate matching by puncturing, and/or a number of frozen bits. One or more coding parameters related to rate matching, such as S and E, could also be determined at 1802. Any of the coding parameters could be read from memory or otherwise provided. Some parameters, such as code length N, could be computed based on a given K and a given code rate R, for example. Similarly, one of S and E could be given, and the other could be calculated as described elsewhere herein. At 1806, a reliability order of sub-channels is determined. A rule set could be used to reduce the number of reliability computations and polynomial comparisons that are involved in determining sub-channel order at 1806, for example, which could make it feasible to determine sub-channel order online when information is to be encoded or decoded. One or more reliability orders could be pre-computed and stored in memory, and accessed at 1806 when needed for encoding.

An ordered sub-channel sequence as determined at 1806, and a disabled sub-channel set as disclosed herein, could be used to select information sub-channels, frozen sub-channels, and/or other types of sub-channels when information is to be encoded at 1810. For example, at least some of the disabled sub-channels are frozen, and preferably all of the disabled sub-channels are frozen. Additional sub-channels could be frozen, depending on whether (N−K) is greater than the number of disabled sub-channels for example. Any additional sub-channels could be frozen based on the sub-channel reliability order.

Codewords are punctured at 1811 for rate matching, and punctured codewords are then transmitted at 1812.

The example method in FIG. 18 is intended for illustrative purposes. Other embodiments could involve performing the illustrated operations in any of various ways, performing fewer or additional operations, and/or varying the order in which operations are performed.

Figure 19:
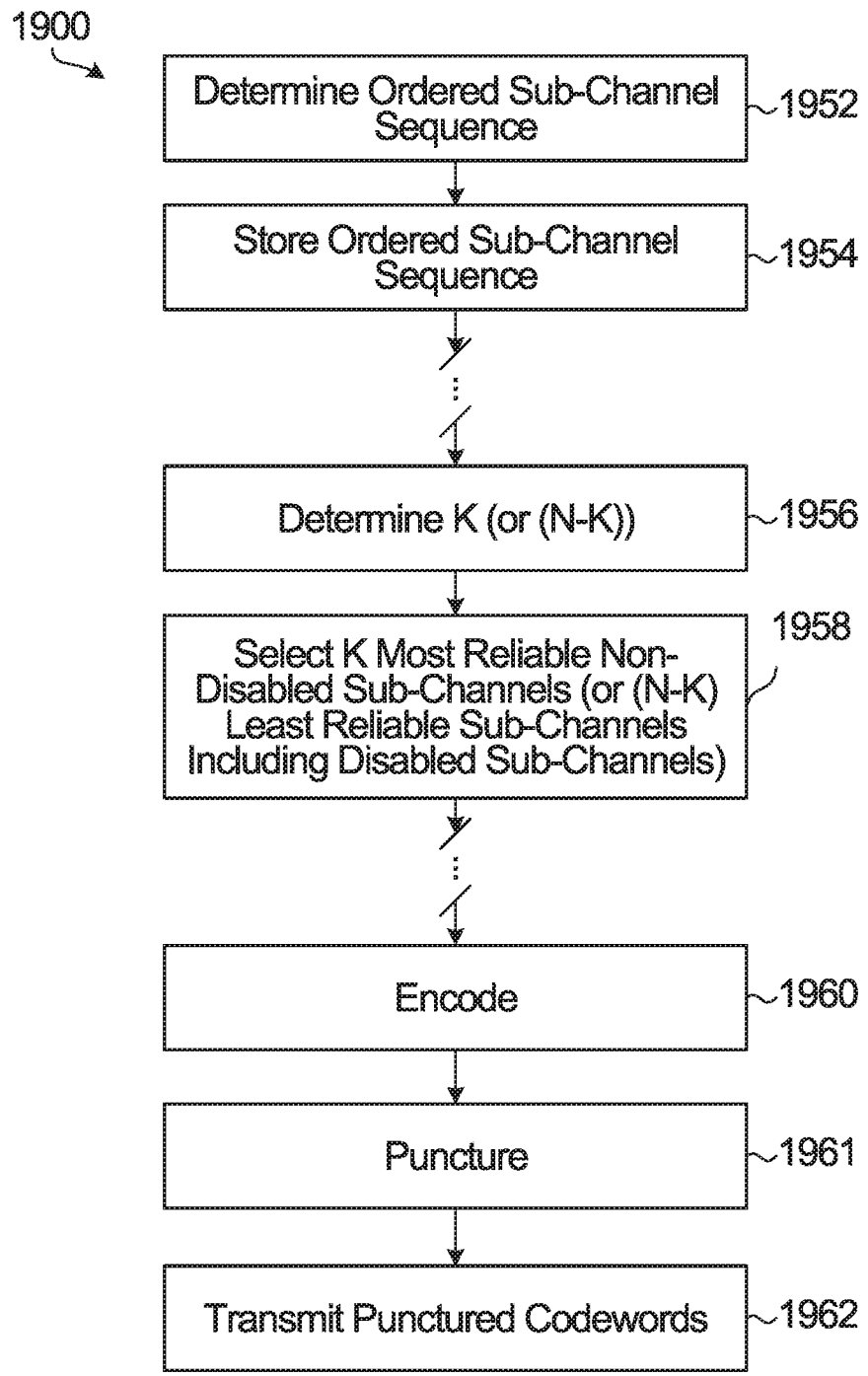
FIG. 19 is a flow diagram of an example coding method according to a further embodiment.

FIG. 19 is a flow diagram of an example of such a coding method 1900 according to a further embodiment. The example method 1900 involves determining an ordered sequence of sub-channels at 1952 and storing the determined ordered sub-channel sequence at 1954. In some implementations, these steps may be optional and/or performed in advance, separately from other coding operations in coding method 1900. For example, the coding method 1900 may instead involve determining an ordered sub-channel sequence at 1952 by retrieving or reading the stored the ordered sub-channel sequence from memory. Other possibilities exist.

One or more coding parameters, which could include K or (N−K) depending on the type of sub-channels to be selected, is determined at 1956, and examples of coding parameters and operations that could be involved in determining such coding parameters are described herein. At 1958, K most reliable sub-channels or (N−K) least reliable sub-channels of the N sub-channels are selected. Sub-channel selection at 1958 also takes into account disabled sub-channels. At least some disabled sub-channels, and preferably all disabled sub-channels, are excluded from selection of the K most reliable sub-channels. Equivalently, at least some of the disabled sub-channels, and preferably all disabled sub-channels, are included in the selection of (N−K) least reliable sub-channels as frozen sub-channels.

The encoding at 1960 involves encoding input bits onto the K most reliable sub-channels, according to the selection at 1958. Codewords that are generated by the encoding at 1960 are punctured at 1961 and transmitted at 1962.

The example method 1900 is intended for illustrative purposes. Other embodiments could involve performing the illustrated operations in any of various ways, performing fewer or additional operations, and/or varying the order in which operations are performed. Other variations could be or become apparent to a skilled person based on the present disclosure.

Figure 20:
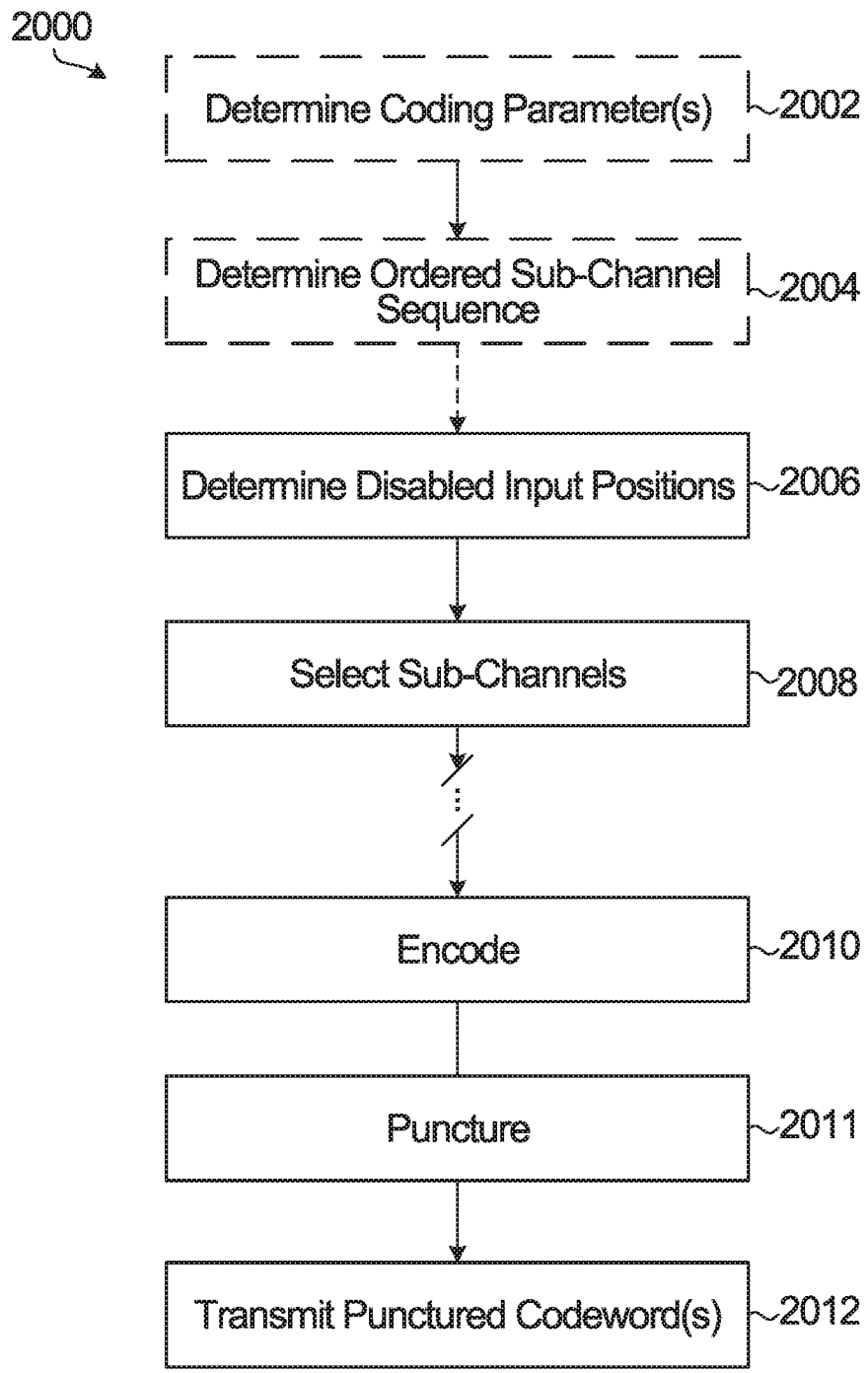
FIG. 20 is a flow diagram of an example coding method according to yet another embodiment.

FIGS. 18 and 19 illustrate general examples of coding methods. FIG. 20 is a flow diagram of an example coding method according to yet another embodiment.

The example method 2000 includes determining one or more coding parameters at 2002. Coding parameters could be read from memory, computed, or otherwise provided. At 2004, an ordered sequence representing a reliability order of sub-channels is determined. Disabled input bit positions of an input bit vector are determined at 2006, based on non-contiguous subsets of consecutive coded bit positions that are to be punctured from a codeword of a polar code. The subsets are non-contiguous, but the coded bit positions within each subset are contiguous. This is described by way of example above as S/E puncturing. More generally, two or more subsets of coded bit positions are non-contiguous in a natural order of the coded bit positions, and the coded bit positions in each subset are consecutive in the natural order. Coded bit positions could correspond to coded bits or coded multi-bit symbols. Input bit positions could similarly correspond to bit positions or multi-bit symbol positions, and are also associated with sub-channels.

One or more of the operations at 2002, 2004, 2006 could be performed when information is to be encoded or decoded, or performed in advance. Ordered sub-channel sequences and/or disabled input bit positions for different coding parameters could be pre-computed and stored in memory, and accessed at when needed for encoding, for example.

An ordered sub-channel sequence and disabled input positions as determined at 2004, 2006 could be used at 2008 in selecting information sub-channels, frozen sub-channels, and/or other types of sub-channels. An input bit vector is encoded at 2010 according to the polar code, to generate a codeword. In the encoding at 2010, information bits are applied to input bit positions of the input bit vector other than the disabled input positions. The other input bit positions are frozen, and have predetermined input values.

At 2011, the non-contiguous subsets of consecutive coded bit positions are punctured from the codeword to generate a punctured codeword. The punctured codeword is then transmitted at 2012. Multiple codewords could be generated, punctured, and transmitted at 2010, 2011, 2012.

The example method 2000, like the other example methods 1800, 1900 in FIGS. 18 and 19, is intended for illustrative purposes. Other embodiments could involve performing the illustrated operations in any of various ways, performing fewer or additional operations, and/or varying the order in which operations are performed. Other variations could be or become apparent to a skilled person based on the present disclosure.

Any one or more of the following could be provided, alone or in any of various combinations, in embodiments:

the non-contiguous subsets include a first subset that includes a first coded bit position and a second subset that includes a last coded bit position—examples are shown in FIGS. 15 and 16, in which a first subset includes the first S coded bit positions and a second subset includes the last E coded bit positions;

the disabled input bit positions include a first subset of consecutive input bit positions including a first input bit position, and a second subset of non-consecutive input bit positions, the second subset being non-contiguous with the first subset—examples of this are also shown in FIGS. 15 and 16, in which a first subset of the disabled input bit positions includes the first D input bit positions and a second subset of the disabled input bit positions includes a number of alternating input bit positions;

the input bit positions include first through $N^{th}$ input bit positions, as shown in FIGS. 15 and 16 by way of example;

the first subset of the disabled input bit positions includes an even number of input bit positions, as in the examples in FIGS. 15 and 16, with D=6 and D=8, respectively;

the second subset of the disabled input bit positions includes even-numbered input bit positions subsequent to the input bit positions of the first subset—in this context "even-numbered" refers to natural order and not necessarily index number, in the sense that sixteen input bit positions could be indexed as positions 1-16 or 0-15 and accordingly the ($2^{nd}$, $4^{th}$, $6^{th}$, . . . ) "even-numbered" input bit positions could have even indices (2, 4, 6, . . . ) with 1-16 indexing or odd indices (1, 3, 5, . . . ) with 0-15 indexing;

the first subset of the disabled input bit positions and the second subset of the disabled input bit positions are spaced apart by a number of non-disabled input bit positions, and the input bit positions in the second subset of the disabled input bit positions are spaced apart from each other by the number of non-disabled input bit positions;

the first subset of the disabled input bit positions and the second subset of the disabled input bit positions are spaced apart by a first number of non-disabled input bit positions, and the input bit positions in the second subset of the disabled input bit positions are spaced apart by a second number, different from the first number, of non-disabled input bit positions;

the first subset of the disabled input bit positions and the second subset of the disabled input bit positions are spaced apart by a first number of non-disabled input bit positions, and the input bit positions in the second subset of the disabled input bit positions are spaced apart by respective numbers of non-disabled input bit positions, the respective numbers of non-disabled input bit positions including at least two different numbers of non-disabled input bit positions;

the determining involves accessing, in a memory, information associated with one or more of the subsets—examples include reading one or both of S and E from memory, and reading one or more indices and/or other information from which coded bit positions in the subsets can be computed or otherwise identified;

determining, based on a total number of coded bit positions that are to be punctured, the coded bit positions in each of the non-contiguous subsets;

the determining involves identifying the disabled input bit positions based on a metric that takes into account the puncturing;

for populating a lookup table in a memory, for example, the following could be performed for each of a plurality of different coding parameters: determining the coded bit positions in each of the non-contiguous subsets; identifying the disabled input bit positions based on a metric that takes into account the puncturing; and storing in a memory information associated with one or more of the subsets;

the polar code is a chained polar code;

the disabled input bit positions include a subset of the input bit positions in the input bit vector that have a lowest performance metric among the input bit positions in the input bit vector;

the performance metric is, or is based on, one or more of: reliability and capacity.

Although FIGS. 18, 19, and 20 show example operations that would be performed at an encoder (or transmitter), other embodiments could be implemented at a decoder (or receiver). A word that is based on a codeword of a code could be received at a receiver, de-rate matched, and decoded, based on sub-channels that are selected by the decoder, a sub-channel selector coupled to the decoder, or a processor in a processor-based embodiment, according to a method as shown in any of FIGS. 18, 19, and 20, and/or as otherwise disclosed herein.

In another embodiment, a non-transitory processor-readable medium stores instructions which, when executed by one or more processors, cause the one or more processors to perform a method as disclosed herein.

Figure 21:
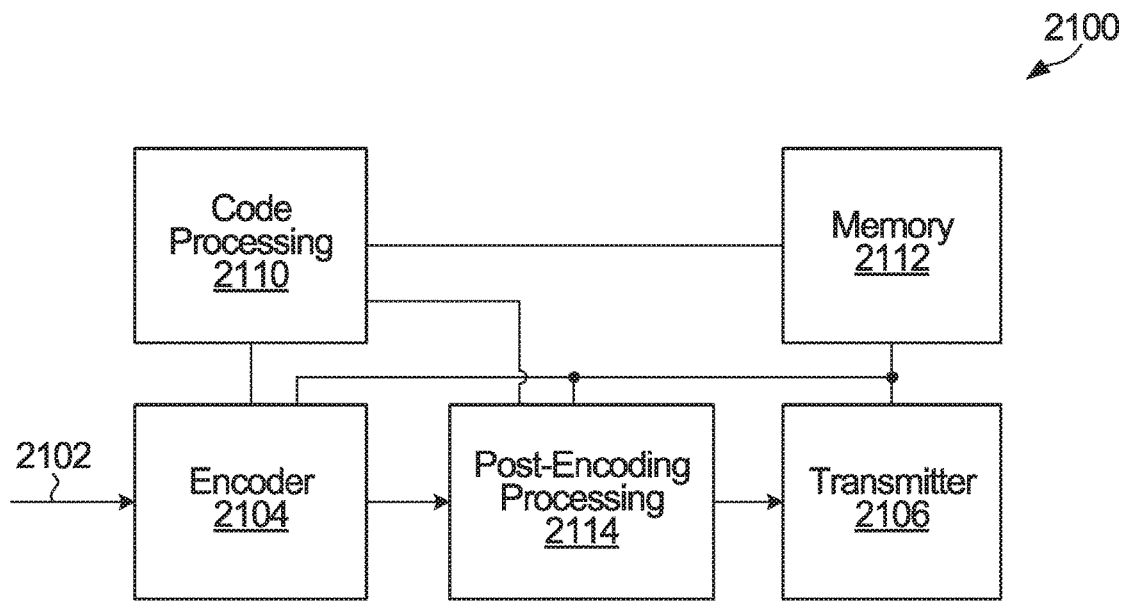
FIG. 21 is a block diagram of an example apparatus for encoding and transmitting codewords.

FIG. 21 is a block diagram of an example apparatus for encoding and transmitting codewords. The apparatus 2100 includes an encoder module 2104 coupled to a transmitter module 2106. The apparatus 2100 also includes a code processing module 2110 coupled to the encoder module 2104 and a post-encoding processing module 2114. The post-encoding processing module 2114 is also coupled to the encoder module 2104 and to the transmitter module 2106. A memory 2112, also shown in FIG. 21, is coupled to the encoder module 2104, to the code processing module 2110, to the post-encoding processing module 2114, and to the transmitter module 2106. Although not shown, the transmitter module 2106 could include a modulator, an amplifier, antenna and/or other modules or components of a transmit chain or alternatively could be configured to interface with a separate (Radio-Frequency, RF) transmission module. For example, some of all of the modules 2104, 2106, 2110, 2112, 2114 of the apparatus 2100 may be implemented in hardware or circuitry (e.g. in one or more chipsets, microprocessors, Application-Specific Integrated Circuits (ASICs), Field-Programmable Gate Arrays (FPGAs), dedicated logic circuitry, or combinations thereof) so as to produce punctured codewords as described herein for transmission by a separate (RF) unit.

In some embodiments, the memory 2112 is a non-transitory computer readable medium at 2112, that includes instructions for execution by a processor to implement and/or control operation of the code processing module 2110, the encoder module 2104, the post-encoding processing module 2114, the transmitter module 2106 in FIG. 21, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a compact disc read-only memory (CD-ROM), universal serial bus (USB) flash disk, or a removable hard disk, at 2112.

In some embodiments, the encoder module 2104 is implemented in circuitry, such as a processor, that is configured to encode input bits or symbols as disclosed herein. In a processor-based implementation of the encoder module 2104, processor-executable instructions to configure a processor to perform encoding operations are stored in a non-transitory processor-readable medium. The non-transitory medium could include, in the memory 2112 for example, one or more solid-state memory devices and/or memory devices with movable and possibly removable storage media.

The code processing module 2110 could be implemented in circuitry that is configured to determine coding parameters, an ordered sub-channel sequence, and disabled input positions or sub-channels as disclosed herein. In some embodiments, the code processing module 2110 is implemented using a processor. The same processor or other circuitry, or separate processors or circuitry, could be used to implement both the encoder module 2104 and the code processing module 2110. As noted above for the encoder module 2104, in a processor-based implementation of the code processing module 2110, processor-executable instructions to configure a processor to perform code processing operations are stored in a non-transitory processor-readable medium, in the memory 2112 for example.

Like the encoder module 2104 and the code processing module 2110, the post-encoding processing module 2114 is implemented in circuitry, such as a processor, that is configured to perform various post-encoding operations. These post-encoding operations could include rate-matching operations such as puncturing as disclosed herein, shortening and/or interleaving, for example. In a processor-based implementation of the post-encoding processing module 2114, processor-executable instructions to configure a processor to perform post-encoding operations are stored in a non-transitory processor-readable medium, examples of which are described above. In an embodiment, the post-encoding processing module 2114 derives a puncturing or shortening scheme from a puncturing or shortening scheme that is to be applied to a codeword prior to transmission. Information indicative of input bit or symbol positions and/or sub-channels that are affected by post-encoding operations, or information from which such bit positions or sub-channels may be determined, may be fed back to the code processing module 2110, stored to the memory 2112, or otherwise made available to the code processing module 2110 by the post-encoding processing module 2114.

In some embodiments of the code processing module 2110, the coding parameters, the ordered sub-channel sequence, and/or the disabled input positions or sub-channels may be determined based on information from the post-encoding processing module 2114. For instance, the disabled input positions, and possibly the ordered sub-channel sequence, may be determined based on the rate-matching scheme determined by the post-encoding processing module 2114. Conversely, in some other embodiments, the post-encoding processing module 2114 may determine a rate-matching scheme based on the coding parameters and/or the ordered sub-channel sequence determined by the code processing module 2110. In yet some other embodiments, the determinations made within the code processing module 2110 and post-encoding processing module 2114 are jointly performed and optimized.

The encoder module 2104 is configured to receive input bits or symbols at 2102, and encode those inputs into codewords based on a polar code. The post-encoding processing module 2114 is configured to puncture the codewords. The transmitter module 2106 is coupled to the encoder module 2104, through the post-encoding processing module 2114 in the example shown, to transmit the punctured codewords.

The encoder module 2104, other components of the example apparatus 2100, and/or a processor in a processor-based embodiment, could implement any of various other features that are disclosed herein. For example, in an embodiment, an apparatus includes a processor and a memory coupled to the processor. The memory stores instructions which, when executed by the processor, cause the processor to perform a method as disclosed herein.

Another embodiment of an apparatus for generating and transmitting a codeword is consistent with FIG. 21, with the code processing module 2110 to determine, based on non-contiguous subsets of consecutive coded bit positions that are to be punctured from a codeword of a polar code, disabled input bit positions of an input bit vector; the encoder module 2104, coupled to the code processing module, to encode the input bit vector according to the polar code to generate a codeword, by applying information bits to input bit positions of the input bit vector other than the disabled input bit positions; the post-encoding processing module 2114, coupled to the encoder module, to generate a punctured codeword by puncturing from the codeword the non-contiguous subsets of consecutive coded bit positions that are to be punctured; and the transmitter 2106, coupled to the post-encoding processing module, to transmit the punctured codeword.

Any one or more of the following could be provided, alone or in any of various combinations, in embodiments:

the non-contiguous subsets include a first subset that includes a first coded bit position and a second subset that includes a last coded bit position;

the disabled input bit positions include a first subset of consecutive input bit positions including a first input bit position, and a second subset of non-consecutive input bit positions, the second subset being non-contiguous with the first subset;

the input bit positions include first through $N^{th}$ input bit positions;

the first subset of the disabled input bit positions includes an even number of input bit positions;

the second subset of the disabled input bit positions includes even-numbered input bit positions subsequent to the input bit positions of the first subset of the disabled input bit positions;

the first subset of the disabled input bit positions and the second subset of the disabled input bit positions are spaced apart by a number of non-disabled input bit positions, and the input bit positions in the second subset of the disabled input bit positions are spaced apart from each other by the number of non-disabled input bit positions;

the first subset of the disabled input bit positions and the second subset of the disabled input bit positions are spaced apart by a first number of non-disabled input bit positions, and the input bit positions in the second subset of the disabled input bit positions are spaced apart by a second, different number of non-disabled input bit positions;

the first subset of the disabled input bit positions and the second subset of the disabled input bit positions are spaced apart by a first number of non-disabled input bit positions, and the input bit positions in the second subset of the disabled input bit positions are spaced apart by respective numbers of non-disabled input bit positions, the respective numbers of non-disabled input bit positions including at least two different numbers of non-disabled input bit positions;

a memory coupled to the code processing module, with the code processing module, or a processor in a processor-based embodiment, being configured to determine the disabled input bit positions by accessing in the memory information associated with one or more of the subsets;

the code processing module or a processor in a processor-based embodiment, is further configured to determine, based on a total number of coded bit positions that are to be punctured, the coded bit positions in each of the non-contiguous subsets;

the code processing module or a processor in a processor-based embodiment, is configured to determine the disabled input bit positions by identifying the disabled input bit positions based on a metric that takes into account the puncturing;

a memory coupled to the code processing module, with the code processing module or a processor in a processor-based embodiment, being further configured to, for each of a plurality of different coding parameters: determine the coded bit positions in each of the non-contiguous subsets; identify the disabled input bit positions based on a metric that takes into account the puncturing; and store in the memory information associated with one or more of the subsets;

the polar code is a chained polar code;

the disabled input bit positions include a subset of the input bit positions in the input bit vector that have a lowest performance metric among the input bit positions in the input bit vector;

the performance metric is, or is based on, one or more of: reliability and capacity.

The apparatus 2100 could implement any of various other features that are disclosed herein. For example, the encoder module 2104, the transmitter module 2106, the code processing module 2110, the post-encoding processing module 2114, and/or a processor in a processor-based embodiment, could be configured to implement any one or more of the features listed or otherwise described herein.

In some alternative embodiments, the functionality of the encoder module 2104, the transmitter module 2106, the code processing module 2110, and/or the post-encoding processing module 2114 described herein may be fully or partially implemented in hardware or alternatively in software, for example in modules stored in a memory such as 2112 and executed by one or more processors of the apparatus 2100.

An apparatus could therefore include a processor, and a memory such as 2112, coupled to the processor, storing instructions which, when executed by the processor, cause the processor to perform the functionality and/or embodiments described herein in relation to the encoder module 2104, the transmitter module 2106, the code processing module 2110, and/or the post-encoding module 2114.

Figure 22:
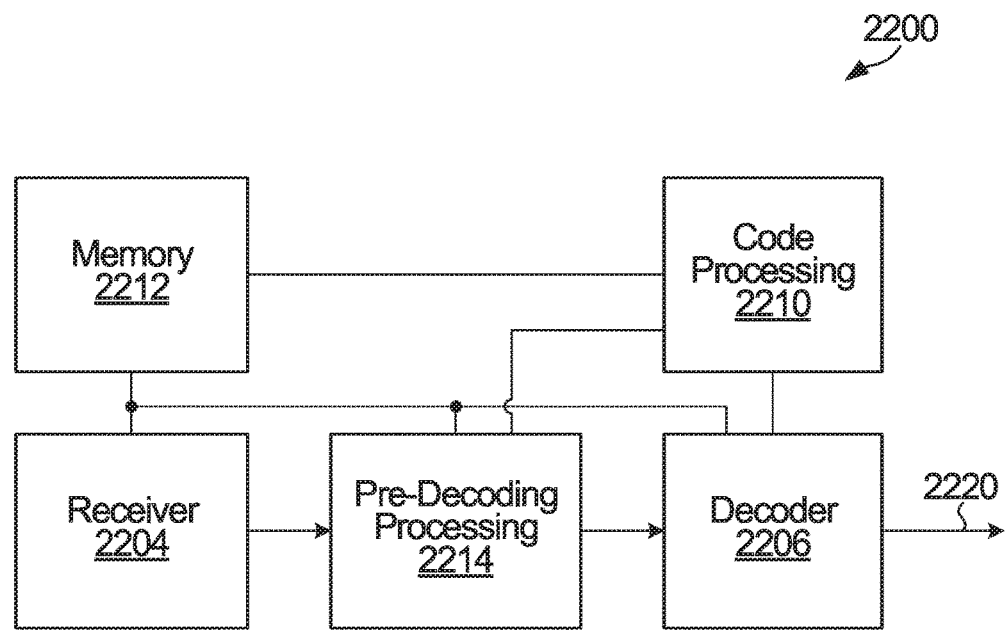
FIG. 22 is a block diagram of an example apparatus for receiving and decoding codewords.

FIG. 22 is a block diagram of an example apparatus for receiving and decoding codewords. The apparatus 2200 includes a receiver module 2204 which is configured to receive signals transmitted wirelessly and which is coupled to a decoder module 2206. The apparatus 2200 also includes a code processing module 2210 coupled to the decoder module 2206 and a pre-decoding processing module 2214. The pre-decoding processing module 2214 is also coupled to the decoder module 2206 and to the receiver module 2204. A memory 2212 also shown in FIG. 22, is coupled to the decoder module 2206, to the code processing module 2210, to the receiver module 2204, and to the pre-decoding processing module 2214.

Although not shown, the receiver module 2204 could include an antenna, demodulator, amplifier, and/or other modules or components of a receive chain or alternatively could be configured to interface with a separate (RF) receiving module. For example, some of all of the modules 2204, 2206, 2210, 2212, 2214 of the apparatus 2200 may be implemented in hardware or circuitry (e.g. in one or more chipsets, microprocessors, ASICs, FPGAs, dedicated logic circuitry, or combinations thereof) so as to receive a word based on a codeword of a chained polar code as described herein. Decoded bits are output at 2220 for further receiver processing.

In some embodiments, the memory 2212 is a non-transitory computer readable medium that includes instructions for execution by a processor to implement and/or control operation of the receiver module 2204, decoder module 2206, the code processing module 2210, and the pre-decoding processing module 2214 in FIG. 22, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a CD-ROM, USB flash disk, or a removable hard disk, at 2212.

The decoder module 2206 is implemented in circuitry, such as a processor, that is configured to decode received codewords as disclosed herein. In a processor-based implementation of the decoder module 2206, processor-executable instructions to configure a processor to perform decoding operations are stored in a non-transitory processor-readable medium. The non-transitory medium could include, in the memory 2212 for example, one or more solid-state memory devices and/or memory devices with movable and possibly removable storage media.

The code processing module 2210 could be implemented in circuitry that is configured to determine ordered sub-channel sequences and disabled input positions, and store information associated with such sequences and positions to the memory 2212. In a processor-based implementation of the code-processing module 2210, processor-executable instructions to configure a processor to perform code-processing operations are stored in a non-transitory processor-readable medium, examples of which are described above. Information representing ordered sub-channel sequences, and/or the selected sub-channels could be provided to the decoder module 2206 by the code processing module 2210 for use in decoding received words, and/or stored in the memory 2212 by the code processing module 2210 for subsequent use by the decoder module 2206.

Like the decoder module 2206 and the code processing module 2210, the pre-decoding processing module 2214 is implemented in circuitry, such as a processor, that is configured to perform pre-decoding operations. These operations could include receiver/decoder-side rate matching operations also known as de-rate-matching operations, such as de-puncturing and/or de-shortening to reverse puncturing/shortening that was applied at an encoder/transmitter side, for example. In a processor-based implementation of the pre-decoding processing module 2214, processor-executable instructions to configure a processor to perform pre-decoding processing operations are stored in a non-transitory processor-readable medium, examples of which are described above. In an embodiment, the pre-decoding processing module 2214 derives a puncturing or shortening scheme from a puncturing or shortening scheme that is to be applied to a received codeword. Information indicative of input positions and/or sub-channels that are affected by pre-decoding processing, or information from which such positions or sub-channels may be determined, may be fed back to the code processing module 2210, stored to the memory 2212, or otherwise made available to the code processing module 2210 by the pre-decoding processing module 2214.

In some embodiments of the code processing module 2210, the ordered sub-channel sequence may be determined based on information from the pre-decoding processing module 2214. For instance, the ordered sub-channel sequence may be determined based on the rate-matching scheme determined by the pre-decoding processing module 2214. Conversely, in some other embodiments, the pre-decoding processing module 2214 may determine a rate-matching scheme based on the coding parameters and/or the ordered sub-channel sequence determined by the code processing module 2210. In yet some other embodiments, the determinations made within the code processing module 2210 and pre-decoding processing module 2214 are jointly performed and optimized.

In some alternative embodiments, the functionality of the receiver module 2204, the decoder module 2206, the code processing module 2210, and/or the pre-decoding processing module 2214 described herein may be fully or partially implemented in software or modules, for example in receiving and decoding modules stored in a memory 2212 and executed by one or more processors of the apparatus 2200.

An apparatus could therefore include a processor, and a memory such as 2212, coupled to the processor, storing instructions which, when executed by the processor, cause the processor to perform the functionality and/or embodiments disclosed herein, or receiving/decoding operations corresponding to transmitting/encoding operations disclosed herein.

The apparatus 2200 could implement any of various other features that are disclosed herein. For example, the decoder module 2206, the receiver module 2204, the code processing module 2210, and/or the pre-decoding processing module 2214 could be configured to implement any one or more of receiving/decoding features corresponding to encoding/transmitting features disclosed herein.

Communication equipment could include the apparatus 2100, the apparatus 2200, or both a transmitter and a receiver and both an encoder and a decoder and other components shown in FIGS. 21 and 22. Such communication equipment could be user equipment or communication network equipment.

Figure 23:
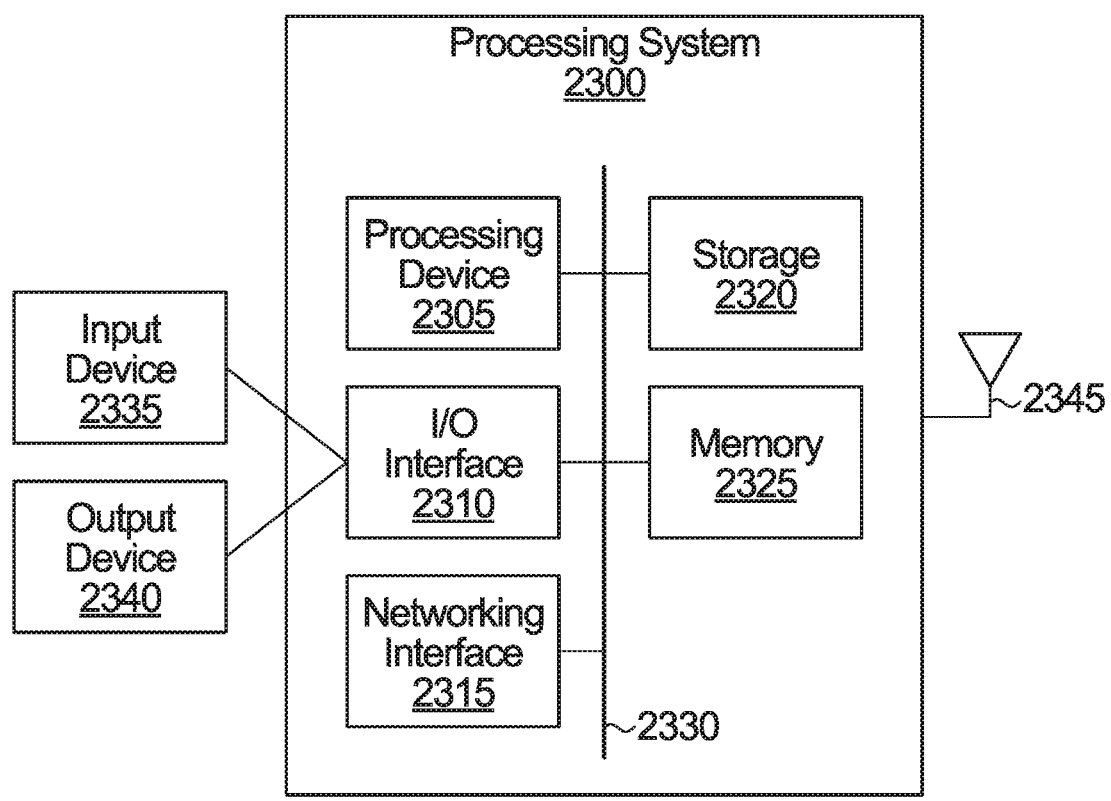
FIG. 23 is a block diagram of an example simplified processing system, which may be used to implement embodiments disclosed herein.

FIGS. 21 and 22 are generalized block diagrams of apparatus that could be used to implement embodiments disclosed herein. FIG. 23 is a block diagram of an example simplified processing system 2300, which may be used to implement embodiments disclosed herein, and provides a higher level implementation example. The apparatus 2100, the apparatus 2200, or both, may be implemented using the example processing system 2300, or variations of the processing system 2300. The processing system 2300 could be a server or a mobile device, for example, or any suitable processing system. Other processing systems suitable for implementing embodiments described in the present disclosure may be used, which may include components different from those discussed below. Although FIG. 23 shows a single instance of each component, there may be multiple instances of each component in the processing system 2300.

The processing system 2300 may include one or more processing devices 2305, such as a processor, a microprocessor, an ASIC, an FPGA, a dedicated logic circuitry, or combinations thereof. The processing system 2300 may also include one or more input/output (I/O) interfaces 2310, which may enable interfacing with one or more appropriate input devices 2335 and/or output devices 2340. The processing system 2300 may include one or more network interfaces 2315 for wired or wireless communication with a network (e.g., an intranet, the Internet, a P2P network, a WAN and/or a LAN) or other node. The network interfaces 2315 may include wired links (e.g., Ethernet cable) and/or wireless links (e.g., one or more antennas) for intra-network and/or inter-network communications. The network interfaces 2315 may provide wireless communication via one or more transmitters or transmit antennas and one or more receivers or receive antennas, for example. In this example, a single antenna 2345 is shown, which may serve as both transmitter and receiver. However, in other examples there may be separate antennas for transmitting and receiving. The processing system 2300 may also include one or more storage units 2320, which may include a mass storage unit such as a solid state drive, a hard disk drive, a magnetic disk drive and/or an optical disk drive.

The processing system 2300 may include one or more memories 2325, which may include a volatile or non-volatile memory (e.g., a flash memory, a random access memory (RAM), and/or a read-only memory (ROM)). The non-transitory memories 2325 may store instructions for execution by the processing devices 2305, such as to carry out examples described in the present disclosure. The memories 2325 may include other software instructions, such as for implementing an operating system and other applications/functions. In some examples, one or more data sets and/or modules may be provided by an external memory (e.g., an external drive in wired or wireless communication with the processing system 2300) or may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

There may be a bus 2330 providing communication among components of the processing system 2300. The bus 2330 may be any suitable bus architecture including, for example, a memory bus, a peripheral bus or a video bus. In FIG. 23, the input devices 2335 (e.g., a keyboard, a mouse, a microphone, a touchscreen, and/or a keypad) and output devices 2340 (e.g., a display, a speaker and/or a printer) are shown as external to the processing system 2300. In other examples, one or more of the input devices 2335 and/or the output devices 2340 may be included as a component of the processing system 2300.

Figure 24:
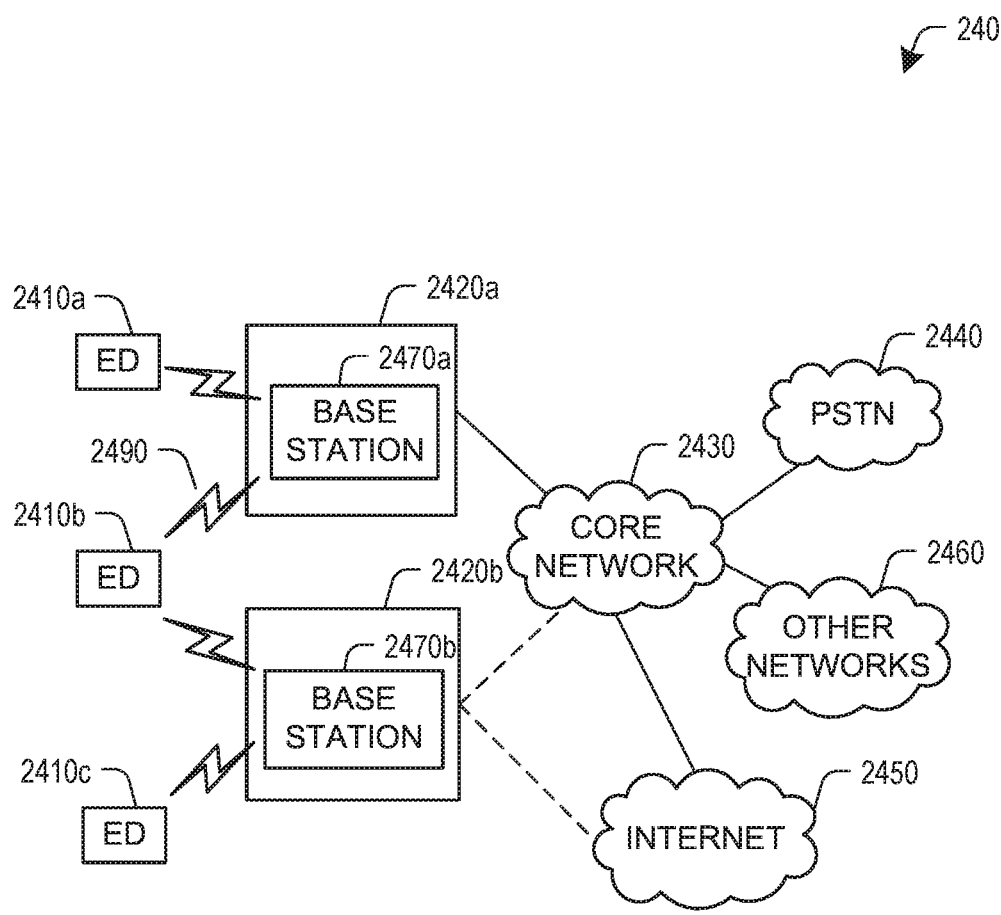
FIG. 24 illustrates an example communication system in which embodiments of the present disclosure could be implemented.

FIG. 24 illustrates an example communication system 2400 in which embodiments of the present disclosure could be implemented. In general, the communication system 2400 enables multiple wireless or wired elements to communicate data and other content. The purpose of the communication system 2400 may be to provide content (voice, data, video, text) via broadcast, narrowcast, user device to user device, etc. The communication system 2400 may operate by sharing resources such as bandwidth.

In this example, the communication system 2400 includes electronic devices (ED) 2410a-2410c, radio access networks (RANs) 2420a-2420b, a core network 2430, a public switched telephone network (PSTN) 2440, the internet 2450, and other networks 2460. Although certain numbers of these components or elements are shown in FIG. 24, any reasonable number of these components or elements may be included.

The EDs 2410a-2410c and base stations 2470a-2470b are examples of communication equipment that can be configured to implement some or all of the functionality and/or embodiments described herein. For example, any one of the EDs 2410a-2410c and base stations 2470a-2470b could be configured to implement the encoding or decoding functionality (or both) described above. In another example, any one of the EDs 2410a-2410c and base stations 2470a-2470b could include an apparatus 2100 (FIG. 21), an apparatus 2200 (FIG. 22), or both.

The EDs 2410a-2410c are configured to operate, communicate, or both, in the communication system 2400. For example, the EDs 2410a-2410c are configured to transmit, receive, or both via wireless or wired communication channels. Each ED 2410a-2410c represents any suitable end user device for wireless operation and may include such devices (or may be referred to) as a user equipment/device (UE), wireless transmit/receive unit (WTRU), mobile station, fixed or mobile subscriber unit, cellular telephone, station (STA), machine type communication (MTC) device, personal digital assistant (PDA), smartphone, laptop, computer, tablet, wireless sensor, or consumer electronics device.

In FIG. 24, the RANs 2420a-2420b include base stations 2470a-2470b, respectively. Each base station 2470a-2470b is configured to wirelessly interface with one or more of the EDs 2410a-2410c to enable access to any other base station 2470a-2470b, the core network 2430, the PSTN 2440, the Internet 2450, and/or the other networks 2460. For example, the base stations 2470a-2470b may include (or be) one or more of several well-known devices, such as a base transceiver station (BTS), a Node-B (NodeB), an evolved NodeB (eNodeB), a Home eNodeB, a gNodeB, a transmission point (TP), a site controller, an access point (AP), or a wireless router. Any ED 2410a-2410c may be alternatively or additionally configured to interface, access, or communicate with any other base station 2470a-2470b, the internet 2450, the core network 2430, the PSTN 2440, the other networks 2460, or any combination of the preceding. The communication system 2400 may include RANs, such as RAN 2420b, wherein the corresponding base station 2470b accesses the core network 2430 via the internet 2450, as shown.

The EDs 2410a-2410c and base stations 2470a-2470b are examples of communication equipment that can be configured to implement some or all of the functionality and/or embodiments described herein. In the embodiment shown in FIG. 24, the base station 2470a forms part of the RAN 2420a, which may include other base stations, base station controller(s) (BSC), radio network controller(s) (RNC), relay nodes, elements, and/or devices. Any base station 2470a, 2470b may be a single element, as shown, or multiple elements, distributed in the corresponding RAN, or otherwise. Also, the base station 2470b forms part of the RAN 2420b, which may include other base stations, elements, and/or devices. Each base station 2470a-2470b transmits and/or receives wireless signals within a particular geographic region or area, sometimes referred to as a "cell" or "coverage area". A cell may be further divided into cell sectors, and a base station 2470a-2470b may, for example, employ multiple transceivers to provide service to multiple sectors. In some embodiments, there may be established pico or femto cells where the radio access technology supports such. In some embodiments, multiple transceivers could be used for each cell, for example using multiple-input multiple-output (MIMO) technology. The number of RAN 2420a-2420b shown is exemplary only. Any number of RAN may be contemplated when devising the communication system 2400.

The base stations 2470a-2470b communicate with one or more of the EDs 2410a-2410c over one or more air interfaces 2490 using wireless communication links e.g. RF, microwave, infrared (IR), etc. The air interfaces 2490 may utilize any suitable radio access technology. For example, the communication system 2400 may implement one or more channel access methods, such as code division multiple access (CDMA), time division multiple access (TDMA), frequency division multiple access (FDMA), orthogonal FDMA (OFDMA), or single-carrier FDMA (SC-FDMA) in the air interfaces 2490.

A base station 2470a-2470b may implement Universal Mobile Telecommunication System (UMTS) Terrestrial Radio Access (UTRA) to establish an air interface 2490 using wideband CDMA (WCDMA). In doing so, the base station 2470a-2470b may implement protocols such as HSPA, HSPA+ optionally including HSDPA, HSUPA or both. Alternatively, a base station 2470a-2470b may establish an air interface 2490 with Evolved UTMS Terrestrial Radio Access (E-UTRA) using LTE, LTE-A, and/or LTE-B. It is contemplated that the communication system 2400 may use multiple channel access functionality, including such schemes as described above. Other radio technologies for implementing air interfaces include IEEE 802.11, 802.15, 802.16, CDMA2000, CDMA2000 1x, CDMA2000 EV-DO, IS-2000, IS-95, IS-856, GSM, EDGE, and GERAN. Of course, other multiple access schemes and wireless protocols may be utilized.

The RANs 2420a-2420b are in communication with the core network 2430 to provide the EDs 2410a-2410c with various services such as voice, data, and other services. The RANs 2420a-2420b and/or the core network 2430 may be in direct or indirect communication with one or more other RANs (not shown), which may or may not be directly served by core network 2430, and may or may not employ the same radio access technology as RAN 2420a, RAN 2420b or both. The core network 2430 may also serve as a gateway access between (i) the RANs 2420a-2420b or EDs 2410a-2410c or both, and (ii) other networks (such as the PSTN 2440, the internet 2450, and the other networks 2460). In addition, some or all of the EDs 2410a-2410c may include functionality for communicating with different wireless networks over different wireless links using different wireless technologies and/or protocols. Instead of wireless communication (or in addition thereto), the EDs 2410a-2410c may communicate via wired communication channels to a service provider or switch (not shown), and to the internet 2450. PSTN 2440 may include circuit switched telephone networks for providing plain old telephone service (POTS). Internet 2450 may include a network of computers and subnets (intranets) or both, and incorporate protocols, such as IP, TCP, UDP. EDs 2410a-2410c may be multimode devices capable of operation according to multiple radio access technologies, and incorporate multiple transceivers necessary to support such.

Figure 25A:
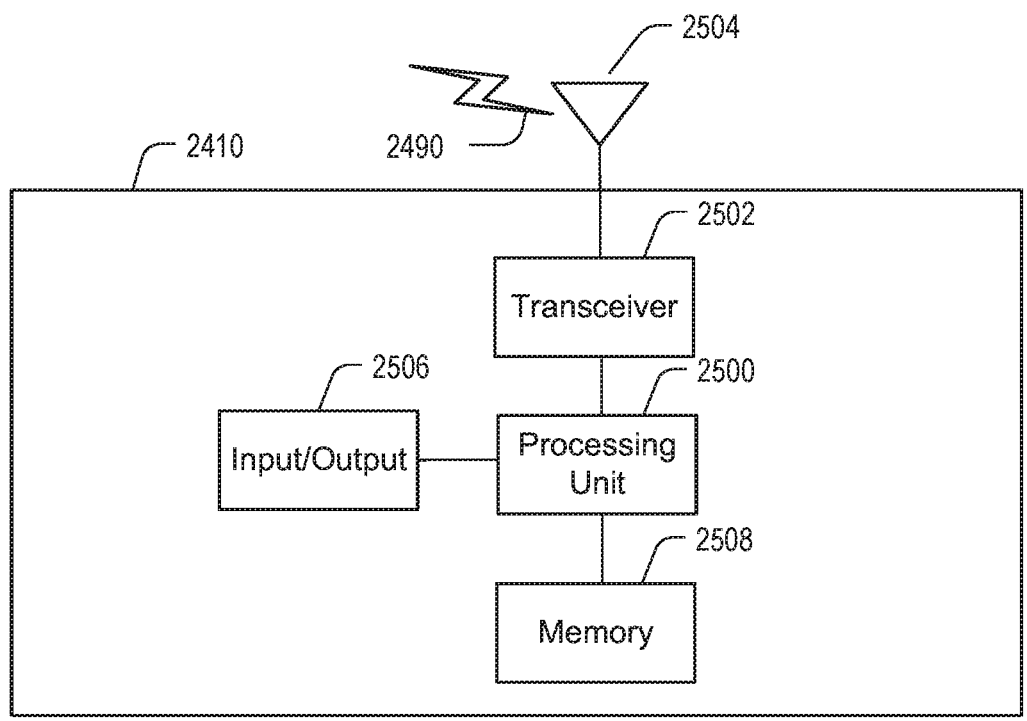
FIGS. 25A and 25B illustrate example devices that may implement the methods and teachings according to this disclosure.
Figure 25B:
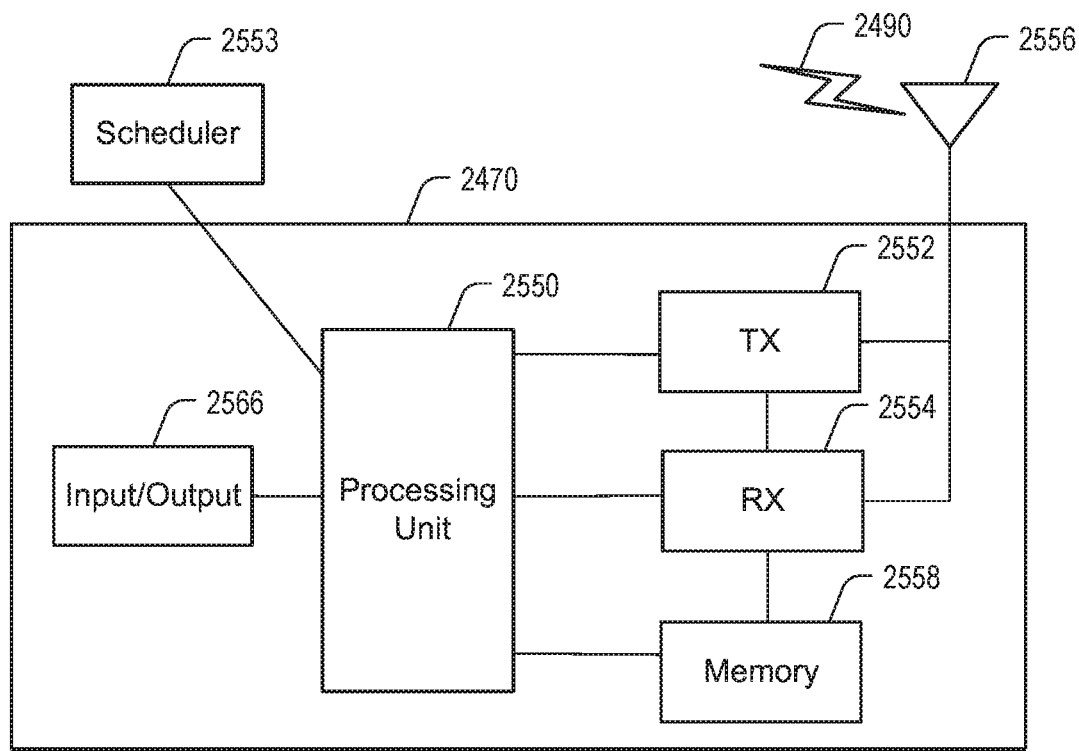

FIGS. 25A and 25B illustrate example devices that may implement the methods and teachings according to this disclosure. In particular, FIG. 25A illustrates an example ED 2410, and FIG. 25B illustrates an example base station 2470. These components could be used in the communication system 2400 or in any other suitable system.

As shown in FIG. 25A, the ED 2410 includes at least one processing unit 2500. The processing unit 2500 implements various processing operations of the ED 2410. For example, the processing unit 2500 could perform signal coding, data processing, power control, input/output processing, or any other functionality enabling the ED 2410 to operate in the communication system 2400. The processing unit 2500 may also be configured to implement some or all of the functionality and/or embodiments described in more detail above. Each processing unit 2500 includes any suitable processing or computing device configured to perform one or more operations. Each processing unit 2500 could, for example, include a microprocessor, microcontroller, digital signal processor, field programmable gate array, or application specific integrated circuit.

The ED 2410 also includes at least one transceiver 2502. The transceiver 2502 is configured to modulate data or other content for transmission by at least one antenna or Network Interface Controller (NIC) 2504. The transceiver 2502 is also configured to demodulate data or other content received by the at least one antenna 2504. Each transceiver 2502 includes any suitable structure for generating signals for wireless or wired transmission and/or processing signals received wirelessly or by wire. Each antenna 2504 includes any suitable structure for transmitting and/or receiving wireless or wired signals. One or multiple transceivers 2502 could be used in the ED 2410, and one or multiple antennas 2504 could be used in the ED 2410. Although shown as a single functional unit, a transceiver 2502 could also be implemented using at least one transmitter and at least one separate receiver.

The ED 2410 further includes one or more input/output devices 2506 or interfaces (such as a wired interface to the internet 2450). The input/output devices 2506 permit interaction with a user or other devices in the network. Each input/output device 2506 includes any suitable structure for providing information to or receiving information from a user, such as a speaker, microphone, keypad, keyboard, display, or touch screen, including network interface communications.

In addition, the ED 2410 includes at least one memory 2508. The memory 2508 stores instructions and data used, generated, or collected by the ED 2410. For example, the memory 2508 could store software instructions or modules configured to implement some or all of the functionality and/or embodiments described above and that are executed by the processing unit(s) 2500. Each memory 2508 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

As shown in FIG. 25B, the base station 2470 includes at least one processing unit 2550, at least one transmitter 2552, at least one receiver 2554, one or more antennas 2556, at least one memory 2558, and one or more input/output devices or interfaces 2566. A transceiver, not shown, may be used instead of the transmitter 2552 and receiver 2554. A scheduler 2553 may be coupled to the processing unit 2550. The scheduler 2553 may be included within or operated separately from the base station 2470. The processing unit 2550 implements various processing operations of the base station 2470, such as signal coding, data processing, power control, input/output processing, or any other functionality. The processing unit 2550 can also be configured to implement some or all of the functionality and/or embodiments described in more detail above. Each processing unit 2550 includes any suitable processing or computing device configured to perform one or more operations. Each processing unit 2550 could, for example, include a microprocessor, microcontroller, digital signal processor, field programmable gate array, or application specific integrated circuit.

Each transmitter 2552 includes any suitable structure for generating signals for wireless or wired transmission to one or more EDs or other devices. Each receiver 2554 includes any suitable structure for processing signals received wirelessly or by wire from one or more EDs or other devices. Although shown as separate components, at least one transmitter 2552 and at least one receiver 2554 could be combined into a transceiver. Each antenna 2556 includes any suitable structure for transmitting and/or receiving wireless or wired signals. Although a common antenna 2556 is shown here as being coupled to both the transmitter 2552 and the receiver 2554, one or more antennas 2556 could be coupled to the transmitter(s) 2552, and one or more separate antennas 2556 could be coupled to the receiver(s) 2554. Each memory 2558 includes any suitable volatile and/or non-volatile storage and retrieval device(s) such as those described above in connection with the ED 2410. The memory 2558 stores instructions and data used, generated, or collected by the base station 2470. For example, the memory 2558 could store software instructions or modules configured to implement some or all of the functionality and/or embodiments described above and that are executed by the processing unit(s) 2550.

Each input/output device 2566 permits interaction with a user or other devices in the network. Each input/output device 2566 includes any suitable structure for providing information to or receiving/providing information from a user, including network interface communications.

The previous description of some embodiments is provided to enable any person skilled in the art to make or use an apparatus, method, or processor readable medium according to the present disclosure.

The present disclosure relates in part to rate matching that is applicable to polar codes, including at least chained polar codes. A relationship between punctured code bits and disabled sub-channels is determined, and the disabled sub-channels include a set of consecutive or contiguous sub-channels beginning with a first sub-channel in a natural order of sub-channels, and then sub-channels with (possibly consecutive) even integer indices.

Embodiments of rate matching as disclosed herein employ puncturing to construct codes with different rates. Punctured code bits are chosen via both natural order of code bit indices and reverse order of code bit indices. Unlike polar code where this results in disabling sub-channels in natural order, in the case of cpolar codes, some disabled sub-channels are according to the natural order and the rest are consistent with the natural ordering of sub-channels with even indices. This type of rate matching can be simple to implement and does not require any interleaving. Preliminary simulation results show that rate matching according to embodiments disclosed herein can improve the performance of cpolar codes compared to state-of-the-art rate matching such as block puncturing.

Various modifications to the embodiments described herein may be readily apparent to those skilled in the art, and the generic principles of the methods and devices described herein may be applied to other embodiments. Thus, the present disclosure is not intended to be limited to the embodiments shown herein but is to be accorded the widest scope consistent with the principles and novel features disclosed herein.

For example, although embodiments are described primarily with reference to bits, other embodiments may involve non-binary multi-bit symbols. If one sub-channel can transmit more than one bit, then several bits can be combined into a symbol in a defined alphabet, and a non-binary symbol is encoded for each sub-channel. Accordingly, polarization kernels are not limited to binary kernels. Symbol-level (Galois field) or non-binary kernels are also contemplated. A non-binary kernel could be preferred for its higher degree of polarization than a binary kernel. However, decoding computation complexity is higher for a non-binary kernel, because a decoder would handle symbols rather than bits.

Non-binary kernels possess characteristics of binary kernels. Furthermore, non-binary kernels could be combined or cascaded with binary kernels to form one polar code.

As noted above, polar codes have been selected for uplink and downlink eMBB control channel coding for the new 5G air interface, also known as 5G new radio (NR). The techniques disclosed herein could be used not only for control data over a control channel but also or instead other types of data (e.g. user data) over any type of channel (e.g. a data channel).

Illustrative examples described herein refer to sub-channel sequences that are in increasing order of a reliability metric. In other embodiments, ordered sequences that are in decreasing reliability order could be used. Similarly, sequences could be generated in increasing order of reliability rather than starting with more reliable channels and building a sequence by adding sub-channels with progressively decreasing reliabilities.

Regarding generator matrices for cpolar codes, the present disclosure is also not restricted to any particular generator matrix representation. Examples above include the following:

$$G_N = C_N \begin{bmatrix} G_{N/2} & 0 \\ 0 & G_{N/2} \end{bmatrix} P_N$$

$$G_N = \begin{bmatrix} G_{N/3} & 0 & 0 \\ 0 & G_{N/3} & 0 \\ C_{N/3} G_{N/3} & C_{N/3} G_{N/3} & G_{N/3} \end{bmatrix}$$

$$G_N = \begin{bmatrix} G_{N/2} & 0 \\ (F^{\otimes (n-1)})^T G_{N/2} & G_{N/2} \end{bmatrix}$$

$$G_N = \begin{bmatrix} G_{N/4} & G_{N/4} & G_{N/4} & 0 \\ \alpha G_{N/4} & \alpha^2 G_{N/4} & C_{N/4} G_{N/4} & 0 \\ \alpha^2 G_{N/4} & \alpha C_{N/4} G_{N/4} & G_{N/4} & 0 \\ C_{N/4} G_{N/4} & G_{N/4} & G_{N/4} & G_{N/4} \end{bmatrix}.$$

Another example is $$G_N = \begin{bmatrix} I_{N/2} & 0 \\ I_{N/2} + C_{N/2} & I_{N/2} \end{bmatrix} \begin{bmatrix} G_{N/2} & 0 \\ G_{N/2} & G_{N/2} \end{bmatrix},$$

and there could be others as well.

The invention claimed is:

1. A method for generating and transmitting a codeword, the method comprising:
   determining, based on non-contiguous subsets of consecutive coded bit positions that are to be punctured from a codeword of a polar code, disabled input bit positions of an input bit vector, the non-contiguous subsets comprising a first subset that includes a first coded bit position and a second subset that includes a last coded bit position;
   encoding the input bit vector according to the polar code to generate a codeword, the encoding comprising applying information bits to input bit positions of the input bit vector other than the disabled input bit positions;
   puncturing from the codeword the non-contiguous subsets of consecutive coded bit positions that are to be punctured, to generate a punctured codeword; and
   transmitting the punctured codeword.

2. The method of claim 1, wherein the disabled input bit positions comprise a first subset of consecutive input bit positions including a first input bit position, and a second subset of non-consecutive input bit positions, the second subset being non-contiguous with the first subset.

3. The method of claim 2, wherein
the input bit positions comprise first through $N^{th}$ input bit positions,
the first subset of the disabled input bit positions comprises an even number of input bit positions, and
the second subset of the disabled input bit positions comprises even-numbered input bit positions subsequent to the input bit positions of the first subset of the disabled input bit positions.

4. The method of claim 2, wherein the first subset of the disabled input bit positions and the second subset of the disabled input bit positions are spaced apart by a number of non-disabled input bit positions, and wherein the input bit positions in the second subset of the disabled input bit positions are spaced apart from each other by the number of non-disabled input bit positions.

5. The method of claim 2, wherein the first subset of the disabled input bit positions and the second subset of the disabled input bit positions are spaced apart by a first number of non-disabled input bit positions, and wherein the input bit positions in the second subset of the disabled input bit positions are spaced apart by a second number of non-disabled input bit positions.

6. The method of claim 2, wherein the first subset of the disabled input bit positions and the second subset of the disabled input bit positions are spaced apart by a first number of non-disabled input bit positions, and wherein the input bit positions in the second subset of the disabled input bit positions are spaced apart by respective numbers of non-disabled input bit positions, the respective numbers of non-disabled input bit positions comprising at least two different numbers of non-disabled input bit positions.

7. The method of claim 1, wherein the determining comprises:
accessing in a memory information associated with one or more of the subsets.

8. The method of claim 1, further comprising:
determining, based on a total number of coded bit positions that are to be punctured, the coded bit positions in each of the non-contiguous subsets.

9. The method of claim 1, wherein the determining comprises:
identifying the disabled input bit positions based on a metric that takes into account the puncturing.

10. The method of claim 1, further comprising, for each of a plurality of different coding parameters:
determining the coded bit positions in each of the non-contiguous subsets;
identifying the disabled input bit positions based on a metric that takes into account the puncturing; and
storing in a memory information associated with one or more of the subsets.

11. The method of claim 1, wherein the polar code is a chained polar code.

12. The method of claim 1, wherein the disabled input bit positions comprise a subset of the input bit positions in the input bit vector that have a lowest performance metric among the input bit positions in the input bit vector.

13. The method of claim 12, wherein the performance metric is based on one or more of: reliability and capacity.

14. A non-transitory processor-readable medium storing instructions which, when executed by one or more processors, cause the one or more processors to:
determine, based on non-contiguous subsets of consecutive coded bit positions that are to be punctured from a codeword of a polar code, disabled input bit positions of an input bit vector, the non-contiguous subsets comprising a first subset that includes a first coded bit position and a second subset that includes a last coded bit position;
encode the input bit vector according to the polar code to generate a codeword, the encoding comprising applying information bits to input bit positions of the input bit vector other than the disabled input bit positions;
puncture from the codeword the non-contiguous subsets of consecutive coded bit positions that are to be punctured, to generate a punctured codeword; and
transmit the punctured codeword.

15. An apparatus for generating and transmitting a codeword, the apparatus comprising:
a code processor configured to determine, based on non-contiguous subsets of consecutive coded bit positions that are to be punctured from a codeword of a polar code, disabled input bit positions of an input bit vector, the non-contiguous subsets comprising a first subset that includes a first coded bit position and a second subset that includes a last coded bit position;
an encoder, coupled to the code processor, configured to encode the input bit vector according to the polar code to generate a codeword, by applying information bits to input bit positions of the input bit vector other than the disabled input bit positions;
a post-encoding processor, coupled to the encoder, configured to generate a punctured codeword by puncturing from the codeword the non-contiguous subsets of consecutive coded bit positions that are to be punctured;
a transmitter, coupled to the post-encoding processor, configured to transmit the punctured codeword.

16. The apparatus of claim 15, wherein the disabled input bit positions comprise a first subset of consecutive input bit positions including a first input bit position, and a second subset of non-consecutive input bit positions, the second subset being non-contiguous with the first subset.

17. The apparatus of claim 16, wherein
the input bit positions comprise first through $N^{th}$ input bit positions,
the first subset of the disabled input bit positions comprises an even number of input bit positions, and
the second subset of the disabled input bit positions comprises even-numbered input bit positions subsequent to the input bit positions of the first subset of the disabled input bit positions.

18. The apparatus of claim 16, wherein the first subset of the disabled input bit positions and the second subset of the disabled input bit positions are spaced apart by a number of non-disabled input bit positions, and wherein the input bit positions in the second subset of the disabled input bit positions are spaced apart from each other by the number of non-disabled input bit positions.

19. The apparatus of claim 16, wherein the first subset of the disabled input bit positions and the second subset of the disabled input bit positions are spaced apart by a first number of non-disabled input bit positions, and wherein the input bit positions in the second subset of the disabled input bit positions are spaced apart by a second number of non-disabled input bit positions.

20. The apparatus of claim 16, wherein the first subset of the disabled input bit positions and the second subset of the disabled input bit positions are spaced apart by a first number of non-disabled input bit positions, and wherein the input bit positions in the second subset of the disabled input bit positions are spaced apart by respective numbers of non-disabled input bit positions, the respective numbers of non-disabled input bit positions comprising at least two different numbers of non-disabled input bit positions.

21. The apparatus of claim 15, further comprising:
a memory coupled to the code processor,
wherein the code processor is further configured to determine the disabled input bit positions by accessing in the memory information associated with one or more of the subsets.

22. The apparatus of claim 15, wherein the code processor is further configured to determine, based on a total number of coded bit positions that are to be punctured, the coded bit positions in each of the non-contiguous subsets.

23. The apparatus of claim 15, wherein the code processor is further configured to determine the disabled input bit positions by identifying the disabled input bit positions based on a metric that takes into account the puncturing.

24. The apparatus of claim 15, further comprising:
a memory coupled to the code processor,
wherein the code processor is further configured to, for each of a plurality of different coding parameters:
determine the coded bit positions in each of the non-contiguous subsets;
identify the disabled input bit positions based on a metric that takes into account the puncturing; and
store in the memory information associated with one or more of the subsets.

25. The apparatus of claim 15, wherein the polar code is a chained polar code.

26. The apparatus of claim 15, wherein the disabled input bit positions comprise a subset of the input bit positions in the input bit vector that have a lowest performance metric among the input bit positions in the input bit vector.

27. The apparatus of claim 26, wherein the performance metric is based on one or more of: reliability and capacity.

* * * * *